United States Patent [19]

Szeto

[11] Patent Number: 4,901,244

[45] Date of Patent: Feb. 13, 1990

[54] APPARATUS FOR, AND METHOD OF, ANALYZING SIGNALS

[76] Inventor: Lai-wan M. Szeto, 57 Axsmith Cres., Willowdale, Ontario, Canada, M2J 3K2

[21] Appl. No.: 165,243

[22] Filed: Mar. 7, 1988

Related U.S. Application Data

[63] Continuation-in-part of Ser. No. 695,017, Jan. 25, 1985, Pat. No. 4,730,257.

[51] Int. Cl.$^4$ .................. G01R 25/00; G01R 23/00
[52] U.S. Cl. .................. 364/481; 324/77 B; 328/133; 364/484
[58] Field of Search .............. 364/481, 484, 485, 487, 364/724, 726; 324/77 B, 77 D; 328/133

[56] References Cited

U.S. PATENT DOCUMENTS

| | | | |
|---|---|---|---|
| 3,903,401 | 9/1975 | Jayant | 364/485 |
| 3,920,978 | 11/1975 | Schmitt et al. | 364/726 |
| 3,984,669 | 10/1976 | Lehmann et al. | 364/726 |
| 4,068,309 | 1/1978 | Drukarch | 364/484 |
| 4,135,243 | 1/1979 | Peregrino et al. | 364/484 |
| 4,144,572 | 3/1979 | Starner et al. | 364/487 |
| 4,178,631 | 12/1979 | Nelson, Jr. | 364/484 |
| 4,279,017 | 7/1981 | Bos et al. | 364/484 |
| 4,301,404 | 11/1981 | Ley | 364/484 |
| 4,310,891 | 1/1982 | Niki | 364/484 |
| 4,319,329 | 3/1982 | Girgis et al. | 364/484 |
| 4,333,150 | 6/1982 | Matty et al. | 364/484 |
| 4,334,273 | 6/1982 | Ikeda | 364/484 |
| 4,363,099 | 12/1982 | Sprinivasan et al. | 364/484 |
| 4,363,100 | 12/1982 | Agnew et al. | 364/484 |
| 4,665,494 | 5/1987 | Tanaka et al. | 364/485 |

OTHER PUBLICATIONS

Harris F. J.: On the Use of Windows for Harmonic Analysis with the Discrete Fourier Transform IEEE, vol. 66, No. 1, Jan. 1978, pp. 51–83.

Phadka et al: A New Measurement Technique for Tracking Voltage Phasors, IEEE Transactions on Power Apparatus and Systems, vol PAS-102 No. 5, May 1983, pp. 1025–1038.

Primary Examiner—Felix D. Gruber

[57] ABSTRACT

The spectral components of both an original signal and a shifted version of the signal, for example a signal which is subjected to a time delay relative to the original signal, are obtained by means of Fourier Transform. This gives sets of first and second spectral components corresponding respectively to the original signal and the shifted signal. The phases of at least one pair of corresponding first and second spectral components are obtained, and subtracted to give a phase difference. The first aspect of the method measures the frequency of corresponding constituent of the original signal from the said phase difference based on a prior knowledge of the amount of shift. Further, having measured the frequency, one can measure the initial phase and amplitude of corresponding constituent of the signal. A second aspect of the method and an apparatus measure the amount of shift between two received signals from the said phase difference by means of a prior knowledge of the frequency of corresponding constituent of the signal. A third aspect of the method and an apparatus detect the existence of dominant constituent of the signal. This approach compares the difference in phases between adjacent spectral components of a signal with a constant value, $(1 - 1/N)\pi$. The measured signals can vary temporally or spatially.

33 Claims, 19 Drawing Sheets

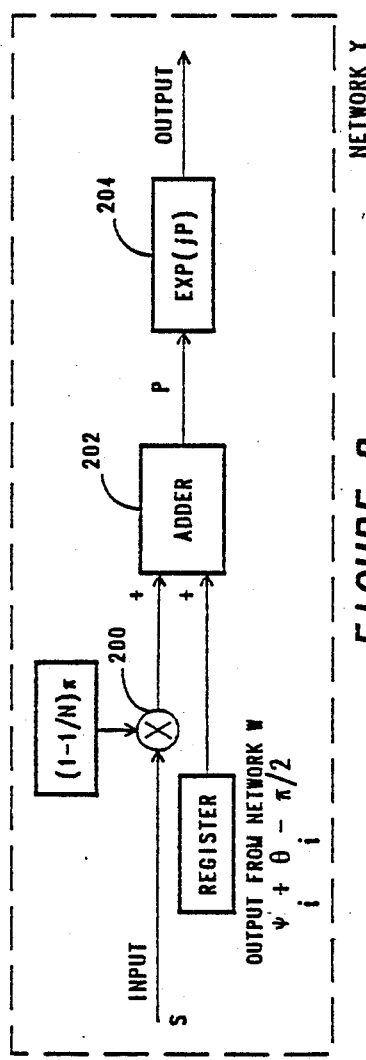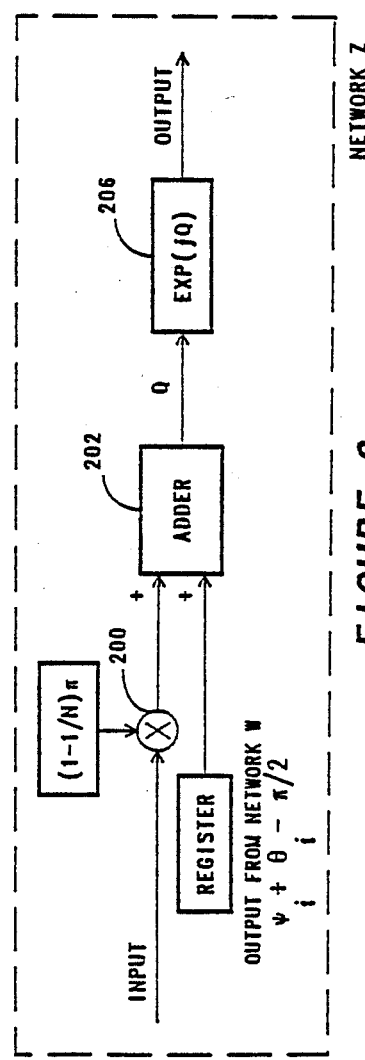

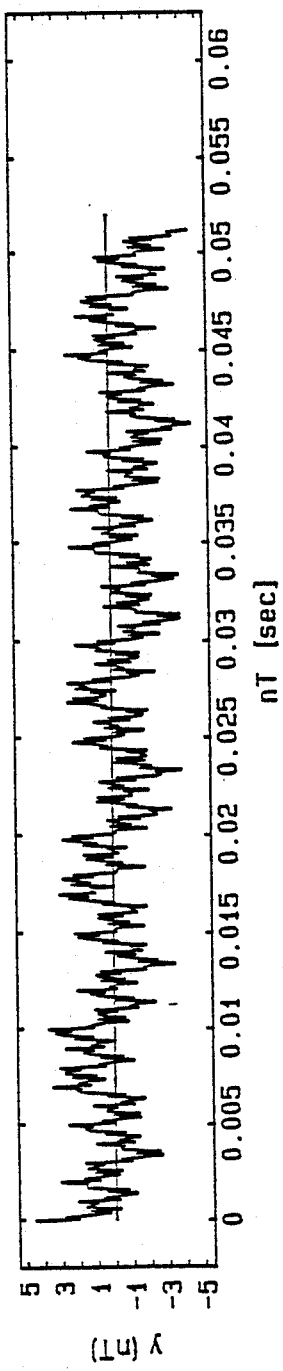
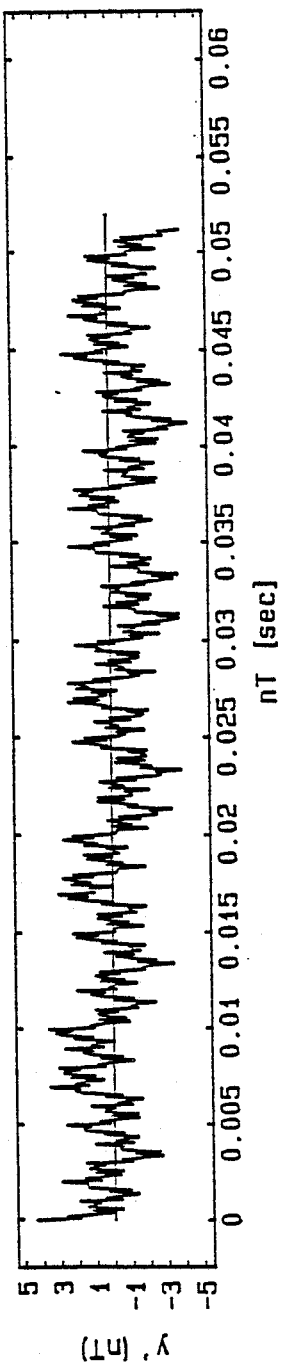
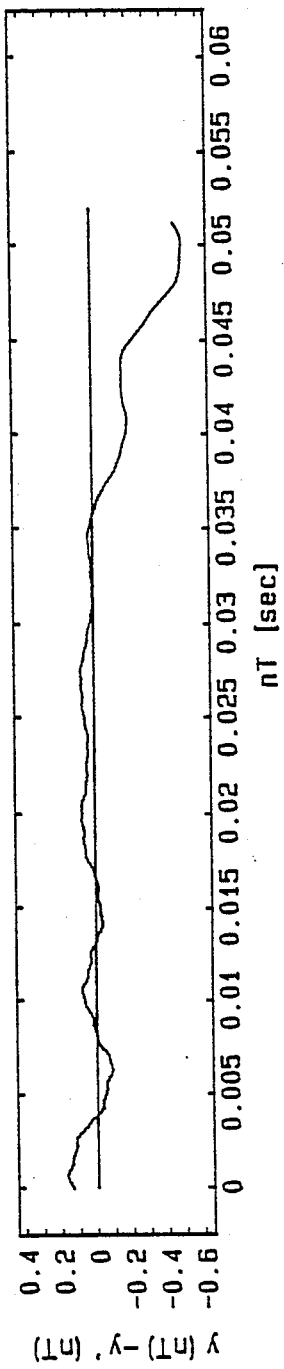

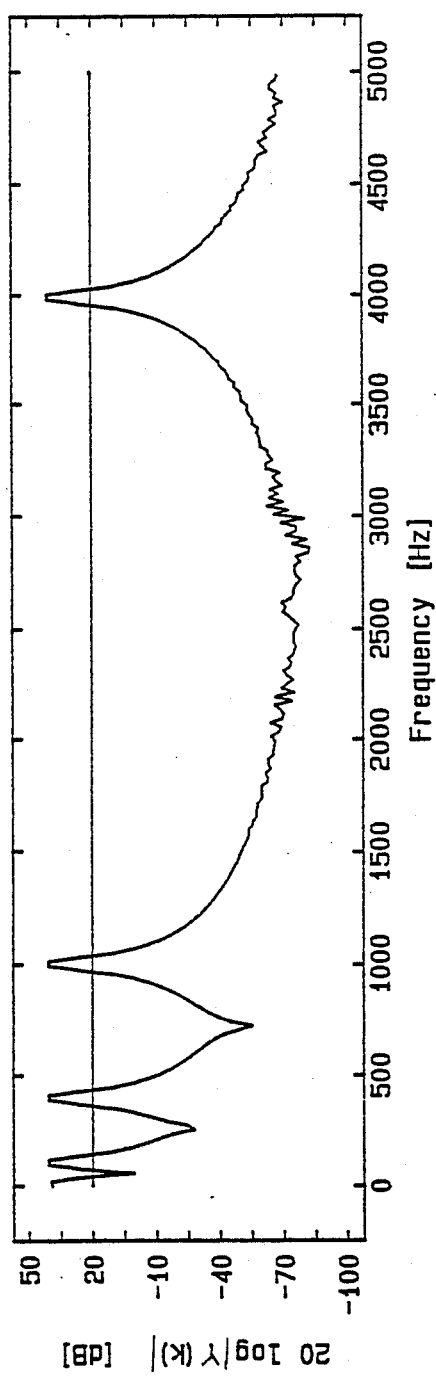
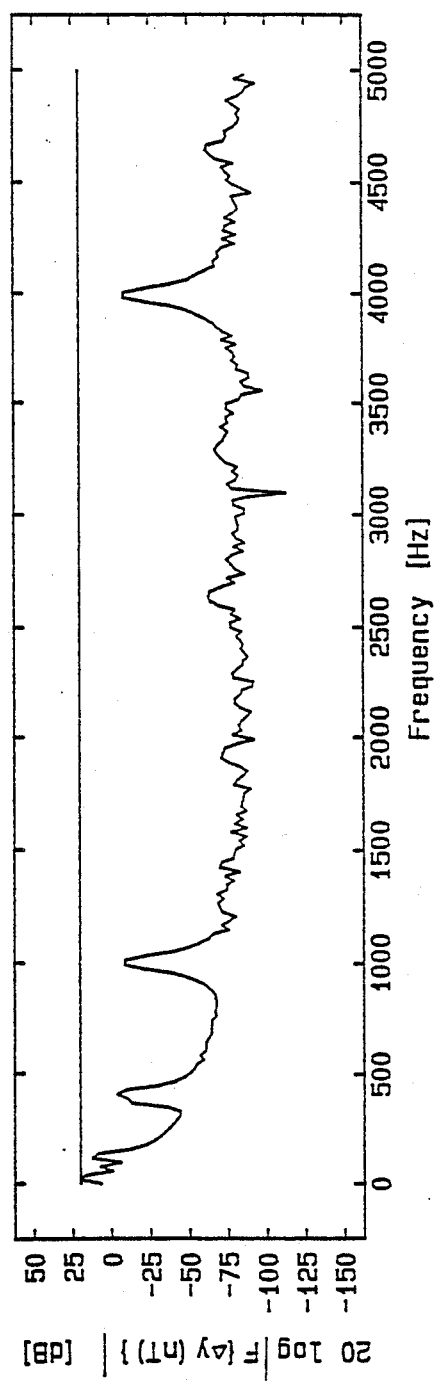

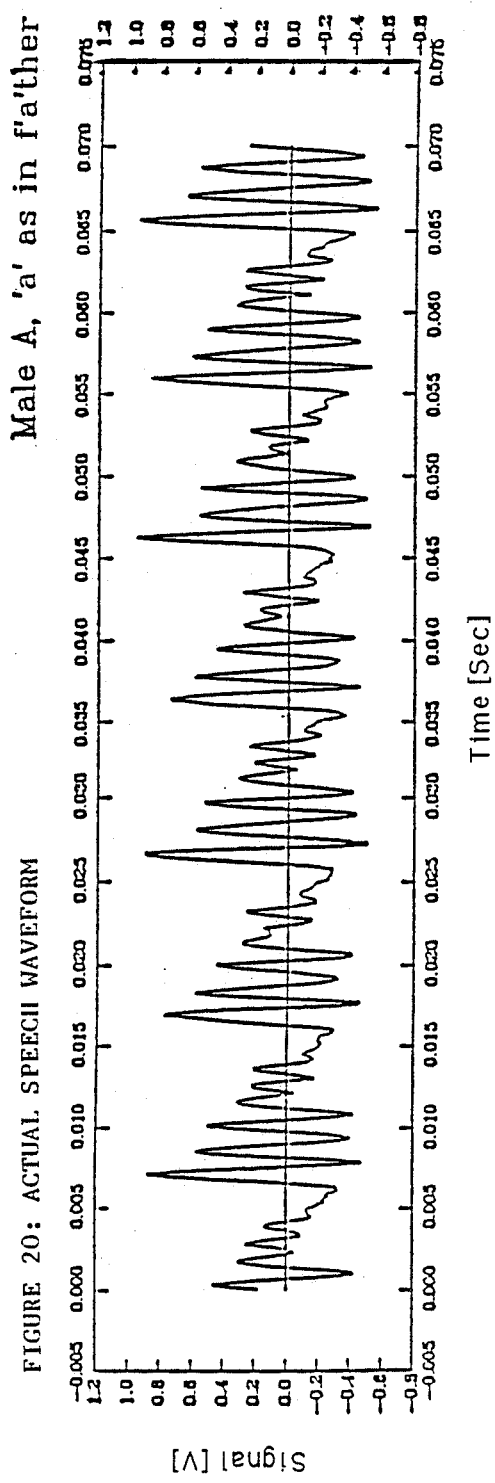
FIGURE 20: ACTUAL SPEECH WAVEFORM
FIGURE 21: RESYNTHESIZED WAVEFORM

FIGURE 22: ERROR WAVEFORM
Difference between Figure 20 and Figure 21
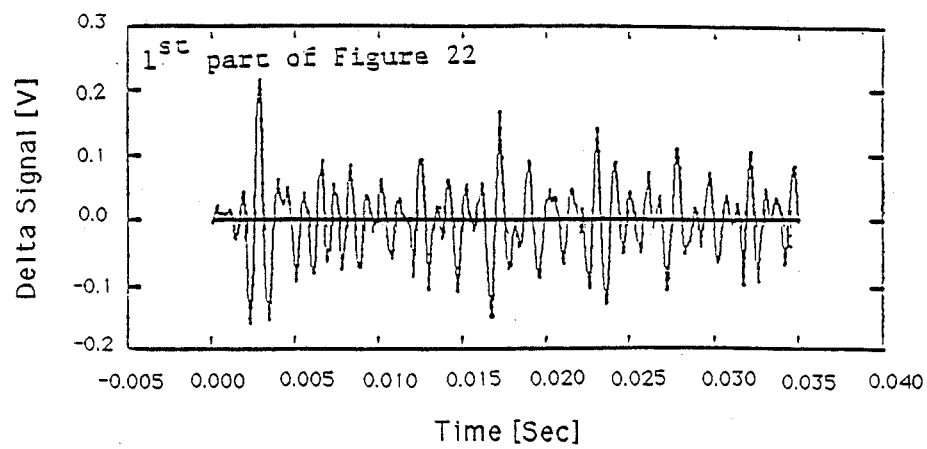
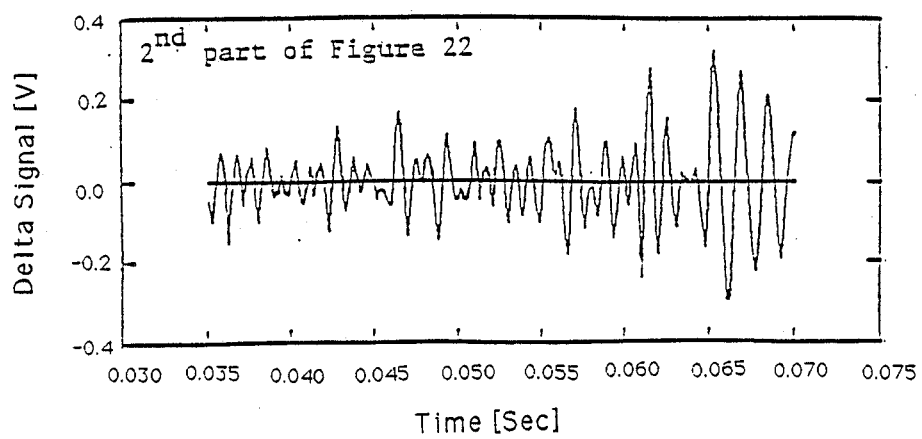

APPARATUS FOR, AND METHOD OF, ANALYZING SIGNALS

CROSS-REFERENCE TO RELATED APPLICATION

The present application is a continuation-in-part of application Ser. No. 695,017 filed on Jan. 25, 1985, now U.S. Pat. No. 4,730,257.

BACKGROUND OF THE INVENTION (a) Field of the Invention

This invention relates to an apparatus methods of analyzing signals. The analyzed signals comprise of one or a finite number of simple vibratory (or sinusoidal) signals, in which an additive noise can be present. The first method is for measuring the signal constituents in terms of their respective frequencies, amplitudes and initial phases. The second method and an apparatus are for measuring the amount of shift between the corresponding constituents of two signals which have a common source, for example, measuring the time delay of a signal constituent received at two sensors. The third method and an apparatus are for detecting or selecting the dominant constituent of the analyzed signal.

There are many fields, (e.g. speech, seismic, radar and biomedical processing) in which a wide variety of vibratory signals are encountered, which can be represented by a summation of sinusoids or complex exponential functions. Some of these signals are characterized by a simple harmonic motion which can be approximately represented by a pure sinusoid, the vibration of a tuning fork is an example. Some signals have more complex periodic waveforms, which are formed by superpositions of some harmonically related simple harmonic motions which can be represented by summation of sinusoids with appropriate harmonically related frequencies, the voiced sound is a well known example. Many other signals comprise of superpositions of simple harmonic motions which are not harmonically related. These signals have irregular waveforms, however, they can still be represented by summation of the sinusoids, the vibrations resulted from operation of some mechanical systems have waveforms of this kind. Additive noise is usually an element of these signals.

Frequently, it is desirable to be able to analyze these signals, whether it is periodic or not, and to break them down into components or extract essential parameters which can be readily handled for collecting or conveying information. It offers the advantage of signal reduction which leads to saving in signal storage or signal transmission. The analysis results can also provide great insight into the characteristics of an unknown physical phenomena from which the signal is produced. It is known that any signal can be built up from a set of pure sinusoids or complex exponential functions of appropriate frequencies, amplitudes and initial phases. By superposition of the resultant series of sinusoids, or complex exponential functions, one can resynthesize or recreate the original waveform.

(b) Description of the Prior Art

With the advent of digital signal processing, many proposals have been made for analyzing complex signals by spectral analysis methods. This approach has been proved to be essential for advanced communication, control and signal interpretation systems. Known methods can be categorized as parametric or non-parametric. Conventional methods are based on the Fourier Transform, and are non-parametric. Most modern methods assume a rational transfer function model, ARMA (Auto-Regressive, Moving-Average), and hence they are parametric, such methods achieve high frequency resolution, at the expense of enormous computations. These techniques are described in "Spectrum Analysis—A Modern Perspective" by S. K. Kay, and S. L. Marple Junior, in the proceedings of the IEEE, volume 69, No. 11, November, 1981, pages 1380–1419, and in "Digital Signal Processing" edited by N. B. Jones, IEE Control Engineering Series 22, 1982. Known techniques cannot be simultaneously both fast and accurate.

The conventional Fourier Transform approach is based on a Fourier series model of the signal. It enables the real-time production of the power spectral density for a large class of signals. Many spectrum analyzers are based on this technique. In general, such a technique is fast and relatively easy to implement, and works well for very long sampled signal and when the signal-to-noise ratio is low. However, this approach has the disadvantage that it lacks adequate frequency precision for small number of samples. The frequency precision in Hertz is approximately equal to a discrete frequency in size, which is the reciprocal of the observatioin interval. This becomes more of a problem when the signal has time-varying spectrum, as for example in the case of speech. Likewise the frequency resolution in multi-dimensional analysis is inversely proportional to the extent of the signal. Alos, one has the problem of spectral leakage, due to the implicit windowing of the singal resulting from the finite number of samples. This distorts the spectrum, and can further reduce the frequency precision. Therefore, it is not a good method for neasuring frequencies of major constituents in the signal. Since this is a non-parametric approach, both the magnitude and the phase spectrum are required to unambiguously represent a signal in the time domain. Hence, it is not used for signal storage or transmission. Traditionally, the phase spectrum of the Fourier Transform has been ignored. It has generally been believed that the magnitude spectrum is more important than the phase spectrum, because the magnitude spectrum shows explicitly the signal,s frequency content. Indeed, in some techniques, the initial phase information has been lost.

Modern spectral estimation methods, developed in the past two decades, are based on a time series model ARMA, mentioned above. Such methods can have the advantage of providing higher frequency resolution. However, it should be noted that such higher frequency resolution can be achieved only under large signal to noise ratios. When this ratio is low, these methods do not give better frequency resolution than the classical Fourier Transform method. The computational requirements of these methods are much higher, and this makes them unattractive, and possibly impractical, for real-time processing.

SUMMARY OF THE INVENTION

It is desirable to provide a method of measuring the frequency, initial phase and amplitude of the respective constituents in a signal.

It is also desirable to provide a method of, and an apparatus for measuring the amount of time delay between the corresponding constituents of two signals.

It is further desirable to provide a method of, and an apparatus for detecting dominant constituents of a signal.

These methods and apparatus should enable real-time detection and measurements with high precision. Additionally, it should be applicable to signals which may vary but are nearly constant over a short observation interval. In other words, these methods and apparatus should work for reasonably few samples in short term analysis with sufficient accuracy and speed.

According to a first aspect of this invention, a method of measuring the signal constituents in terms of their respective frequencies, initial phases and amplitudes, is characterized by:

(i) Taking the Fourier Transform of a signal on a first basis set to create a plurality of first spectral components representative of the signal;

(ii) Separately applying a shift to said signal to create a shifted signal;

(iii) Taking the Fourier Transform of the shifted signal on a second basis set to create a plurality of second spectral components representative of the shifted signal;

(iv) Obtaining the phases of at least one pair of corresponding first and second spectral components;

(v) Substracting the phases of the corresponding first and second spectral components, to derive a phase difference; and (vi) Obtaining the frequency of the corresponding constituent of the original signal from the respective phase difference; The said frequency measured in (vi) can then be used to obtain the initial phase, and the amplitude of the corresponding constituent of the original signal. Hence, a signal can be decomposed into its constituents using this method. The unwanted noise constituent in the signal are dropped out in the process of measuring the signal constituents and reconstructing the signal based on the results of measurement.

According to the second aspect of this invention, a method of measuring the shift between the corresponding constituent of two signals, is characterized by:

(i) Taking the Fourier Transform of a signal on a first basis set to create a plurality of first spectral components representative of the original signal;

(ii) Taking the Fourier Transform of the shifted signal on a second basis set to create a plurality of second spectral components representative of the shifted signal;

(iii) Obtaining the arguments of at least one pair of corresponding first and second spectral components;

(iv) Substracting the arguments of the corresponding first and second spectral components, to derive a phase difference; and (v) Obtaining the shift of the corresponding constituent of the original signal from the respective phase difference;

There is provided an apparatus for use in measuring the shift between the corresponding constituents of two signals, the apparatus comprising:

(i) First transform means for applying a Fourier Transform to an original signal, to create a plurality of first spectral components;

(ii) Second transform means for applying a Fourier Transform to the shifted signal to create a plurality of second spectral components;

(iii) Argument obtaining means, for obtaining the arguments of the corresponding first and second spectral components;

(iv) Phase difference obtaining means, connected to the argument obtaining means; and (v) Shift obtaining means, connected to the phase difference obtaining means, for obtaining the shift between the corresponding constituent of the original signal and the shifted signal from the said phase difference.

According to a third aspect of this invention, a method of detecting the dominant constituent of the analyzed signal is characterized by:

(i) Obtain the difference between the phase of one spectral component and the phase of the preceding spectral component or subsequent spectral component, and determine whether that difference is equal to the value $(1-1/N)\pi$ within predetermined tolerances, where N is the total number of analyzed signal samples.

(ii) Optionally, this method can be assisted by comparing the magnitude of the corresponding spectral component with a predetermined threshold value, the magnitude of the preceding spectral component, and the magnitude of the subsequent spectral component.

There is provided an apparatus for use in detecting the dominant constituent of a signal thereof, the apparatus comprising:

(i) Phase difference obtaining means, connected to the argument obtaining means; and (ii) Comparison means, connected to the phase difference obtaining means, to determine if the said phase difference is equal to $(1-1/N)\pi$ within the predetermined tolerances.

The present invention is based on the realization that, the phase difference between adjacent spectral components of a vibratory signal is $(1-1/N)\pi$. This property is therefore used to detect the existence of a dominant constituent. It also based on the realization that, a shift of a signal in time domain causes phase shift in frequency domain. In addition, at a frequency basis that is close to the frequency of a particular sinusoidal or complex exponential component in the signal, the contribution of this constituent to the phase and magnitude components of the particular frequency basis is much more significant in comparison with that contributed by other constituents in the signal, the phase and magnitude of the constituent can be approximated by the phasor (or phasors for certain windows) at this frequency basis. It is expected that the technique will frequently be applied to a time-varying signal and in this case the shift will be a time shift. However, the technique can be applied to many situations where one parameter varies with another parameter.

To determine the parameters of the sinusoids forming a time-varying signal, one should compare the original signal and a time-shifted signal, to obtain a set of phase differences at dominant spectral components. The frequencies of the sinusoids corresponding to the dominant or main spectral components can then be quickly, and simply obtained from the phase differences. Once the frequencies are measured, the initial phases and amplitudes of the dominant constituents can also be obtained. In contrast to known techniques, the method of the present invention can be readily implemented in real time, and does not require a large number of signal samples.

Time delay measurement is another application of this inventive concept. By knowing the frequency corresponding to the dominant constituent and the phase difference between the corresponding spectral components of an original signal and the shifted signal, the amount of shift can be measured.

BRIEF DESCRIPTION OF THE DRAWINGS

For a better understanding of the present invention, and show more clearly how it may be carried into effect, reference will now be made, by way of example, to the accompanying drawings, which show embodiments of the present invention, and in which:

FIG. 8 shows another network forming part of the amplitude obtaining unit of FIG. 6;

FIG. 9 shows another network forming part of the amplitude obtaining unit of FIG. 6;

FIG. 15 shows a graph of an original signal generated from parameters of Table 1;

FIG. 16 shows a graph of a resynthesized signal generated from parameters obtained by this method, the parameters are listed in Table 2;

FIG. 17 is a graph of the estimation error between the signals shown in FIG. 15 and FIG. 16;

FIG. 18 is a graph of the frequency spectrum for the original signal.

FIG. 19 is a graph of the frequency spectrum of the estimation error of FIG. 17.

FIG. 20 is a graph of a speech signal,

FIG. 21 is graph of the resynthesized signal generated from parameters obtained by this method, the parameters are listed in Table 3, FIG. 22 is a graph of the estimation error between the speech signal shown in FIG. 20 and FIG. 21.

DESCRIPTION OF THE ILLUSTRATED EMBODIMENTS

As mentioned, the present invention is applicable to many different signals, whether periodic or non-periodic. The signals can vary temporally or spatially. Further, the signal can comprise of constituents which can be approximately represented by sinusoids or complex exponential functions. In some cases a parameter of interest may be analogous to frequency, but is not strictly an operating frequency. For example, a radar is used to determine the distance of objects. It transpires that one needs to sample the signal for discrete variations in the operating frequency, and in this case the distance becomes in effect the frequency parameter of the signal to be analyzed. For simplicity, the invention is described only in relation to a time varying signal comprising sinusoids, although it can be applied to such other signals.

Figure 1:
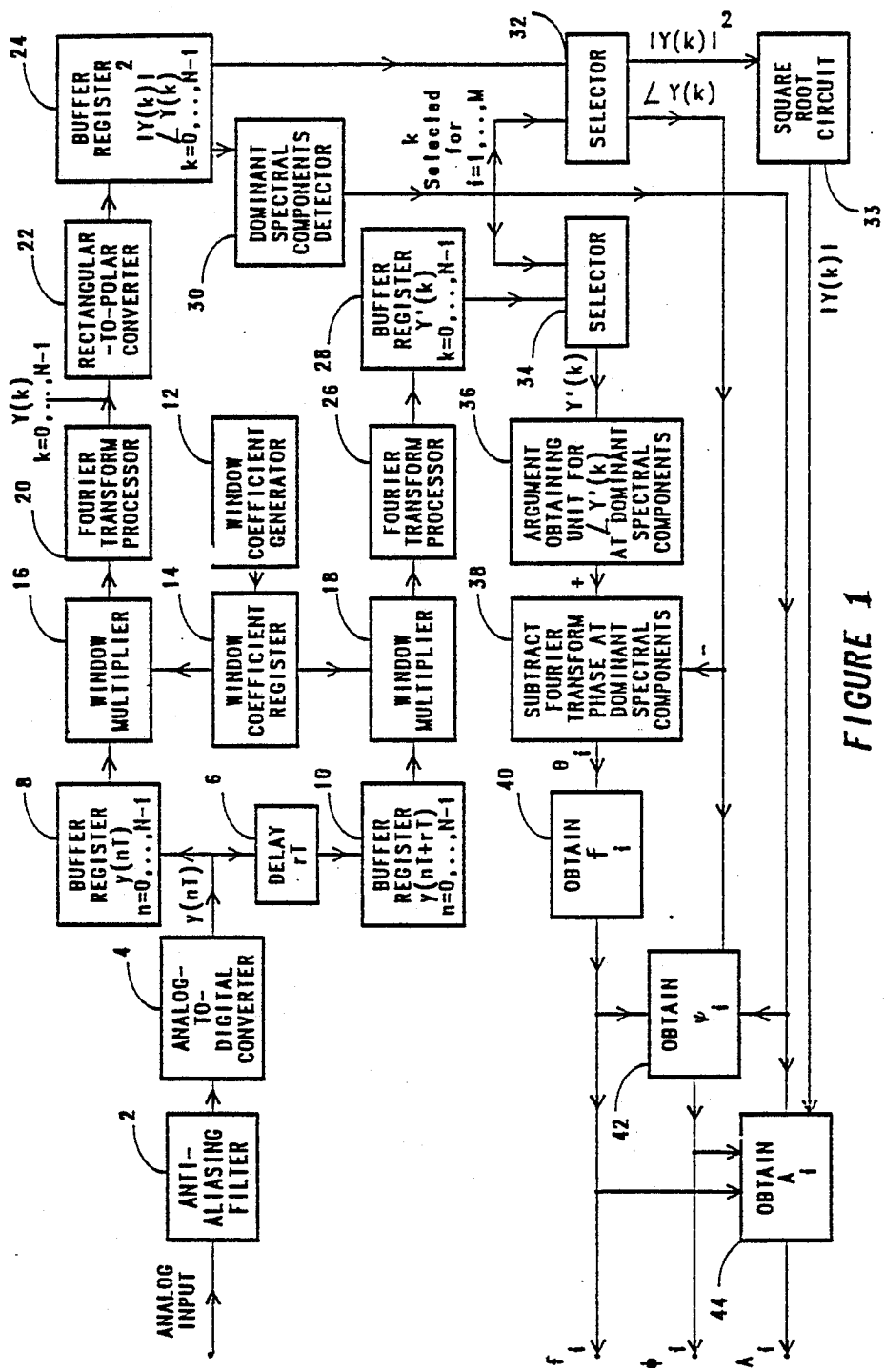
FIG. 1 shows a block diagram of a first embodiment of a system in accordance with the present invention to measure the frequencies, initial phases and amplitudes of the signal constituents.

Referring first to FIG. 1, there is shown in block form a circuit of an apparatus, for implementing the present invention. In known manner, the circuit includes an anti-aliasing filter 2, which has an input for an analog signal. The output of the anti-aliasing filter 2 is connected to an analog-to-digital converter 4, where the analog input is converted to a digital signal. For a digital input, a digital anti-aliasing filter would be used. This digital signal is represented by y(nT), where n is an integer that is an index for the discrete sampled signal, and where T is a sampling period in seconds. Here, we are concerned with signals which comprise of a limited number of sinusoids. As is known, this signal can be represented as in the following equation:

$$y(nT) = \sum_{i=1}^{M} A_i \sin(2\pi f_i nT + \psi_i) + A_0 \qquad \text{Eqn (1)}$$

$$n = 0,1,2,\ldots, N-1$$

where
T = the sampling period in seconds
n = an integer, index for the discrete sampled signal
N = total number of samples within the time window
$A_i$ = amplitude of $i^{th}$ sinusoid
$f_i$ = frequency of $i^{th}$ sinusoid
$\psi_i$ = initial phase of $i^{th}$ sinusoid
$A_0$ = D.C. component As set out in this equation, it is assumed that various parameters representing the signal constituents, namely the amplitude, frequency and initial phase do not vary. There are of course many signals in which these parameters vary considerably. However, there are also other signals in which these parameters are either constant as assumed, or only vary slowly with time. In the latter case, for a short time period, one can assume that they are constant.

In accordance with the present invention, it is necessary to process both the original signal and a shifted signal. In the present embodiment, this is achieved by providing two separate processing lines. In a first, upper processing line, there is a buffer register 8, in which values of the signal are stored.

At the same time, the lower processing line commences with a delay unit 6, in which a delay rT is added to the original signal. As a result, a shifted signal is obtained, which can be represented by the following equation:

$$y(nT + rT) = \sum_{i=1}^{M} A_i \sin(2\pi f_i(n+r)T + \psi_i) + A_0 \quad \text{Eqn (2)}$$

$r$ = an integer $n = 0,1,2,\ldots,N-1$

This equation shows one of the well-known properties of the Fourier Transform, which states that if a signal is advanced in time by rT seconds, then the spectrum will be modified by a linear phase shift of $2\pi f_i rT$.

The second processing line includes a corresponding second buffer register 10, in which values of the shifted signal are stored. One then has the original signal and the shifted signal in the two buffer registers 8, 10. Timing is controlled such that when the buffer registers are storing signal in regular intervals of time, the downstream apparatus operate on the previous time frames. The two buffers can also be combined to form only one buffer with extra samples for the time delay and connections to both processing lines.

In accordance with the present invention, it is necessary to effect a Fourier Transform of these two signals. To provide the necessary window function, a window coefficient generator 12 is provided to supply the window coefficient to a window coefficient register 14 at initialization. The window coefficient register 14 is connected to window multipliers 16, 18 in the two processing lines. Each window multiplier 16, 18 serves to multiply signal from a respective buffer register 8, 10 by the chosen window function. Different window functions can be used, depending upon the characteristics required. For simplicity, a simple rectangular window can be used. Alternatively, one could use a Hanning window or a Hamming window. It should be borne in mind that the finite samples results in a spectral leakage problem. By careful choice of the window function, the leakage problem can be reduced.

Then, in the two processing lines there are Fourier Transform processors 20, 26. These Fourier Transform processors 20, 26 effect a discrete Fourier Transform of the windowed signal, to produce a periodic extension in time of the windowed signal. For a rectangular window, projections of the original signal on the basis set which expands the entire signal space can be obtained as the following equation:

$$Y(k) = \frac{1}{2} \sum_{i=1}^{M} A_i \left\{ \left( \frac{\sin \pi (f_i NT - k)}{\sin \frac{\pi}{N}(f_i NT - k)} \exp\left\{ j\left[ \psi_i - \frac{\pi}{2} + (1 - 1/N)(f_i NT - k)m \right] \right\} + \right.\right.$$

$$\left.\left. \frac{\sin \pi (f_i NT + k)}{\sin \frac{\pi}{N}(f_i NT + k)} \exp\left\{ -j\left[ \psi_i - \frac{\pi}{2} + (1 - 1/N)(f_i NT + k)m \right] \right\} \right) \right\} +$$

$$A_0 \delta(k) \quad \text{Eqn (3)}$$

where $k = 0,1,2,\ldots,N-1$ is an ordered index for the basis. A corresponding equation can be obtained for the transform of the shifted signal.

As can be seen from this equation, for any k in the discrete frequency domain, the Fourier Transform Y(k) is a resultant of a number of complex vectors. These vectors are projections of all sinusoids on the $k^{th}$ basis. For the $i^{th}$ sinusoid, the projections will be stronger on the closest $k^{th}$ basis where:

$$f_i NT \approx k$$

In other words, when the discrete frequency corresponding to the $k^{th}$ basis is close to $f_i$ provided that no other sinusoid has a frequency close to the same basis, the magnitude of the first complex vector for this particular sinusoid i is much higher than the magnitude of all the other complex factors making up that component. Due to the small contribution of the other factors, the resultant Y(k) is almost equal to this complex factor, and we can write:

$$\text{Amp }[Y(k)]\bigg|_{k \approx f_i NT} \approx \frac{1}{2} \frac{A_i \sin \pi (f_i NT - k)}{\sin \frac{\pi}{N}(f_i NT - k)} \quad \text{Eqn (4)}$$

$$\text{Arg }[Y(k)]\bigg|_{k \approx f_i NT} \approx \psi_i - \frac{\pi}{2} + \pi(1 - 1/N)(f_i NT - k) \quad \text{Eqn (5)}$$

In these equations, the approximately equal sign is used for accuracy, but for clarity in the following discussion an ordinary equal sign is used.

Now, for the shifted signal y(nT+rT), one obtains a similar equation. From the Fourier Transform of this equation and using the similar argument to that outlined above, we can show that for the sinusoid i, we get the following:

$$\text{Amp }[Y(k)]\bigg|_{k \approx f_i NT} = \frac{1}{2} \frac{A_i \sin \pi (f_i NT - k)}{\sin \frac{\pi}{N}(f_i NT - k)} \quad \text{Eqn (6)}$$

and $$\text{Arg }[Y(k)]\bigg|_{k \approx f_i NT} = \quad \text{Eqn (7)}$$

$$2\pi f_i rT + \psi_i - \frac{\pi}{2} + \pi(1 - 1/N)(f_i NT - k)$$

Comparison of equations 4 and 5 with the corresponding equations 6 and 7 will show that, as expected, the magnitude of the spectral component is unchanged, and that the argument is altered by a phase shift term $2\pi f_i rT$. Accordingly, as the amount of shift is varied, the magnitude remains unchanged, but the respective phase difference varies.

Figure 2:
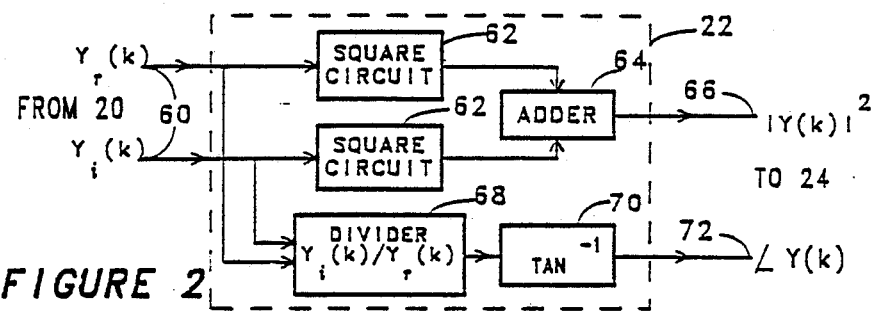
FIG. 2 shows a block diagram of a rectangular-to-polar converter forming part of the apparatus of FIG. 1.

In the first signal line, following the Fourier Transform processor 20, there is a rectangular-to-polar converter 22, in which the output of the processor 20 is converted to polar coordinates. The rectangular-to-polar converter is shown in detail in FIG. 2. As indicated at 60, it has inputs for the real and imaginary parts of each component of the signal Y, namely $$Y_r(k), Y_i(k)$$

The input 60 are connected to respective square circuits 62, in which the real and imaginary parts are squared. These squared quantities are then added in an adder 64, to give the squared value of the magnitude of each component as indicated at an output 66. The inputs 60 are further connected to a divider 68 in which the imaginary part of each component is divided by the real part. The resultant is transmitted to a unit 70 in which the operator $TAN^{-1}$ is performed. This gives the argument of each component at an output 72.

A buffer register 24 receives the output of the converter 22, and stores the squared values of the magnitude and the argument for each component of the transformed signal.

Figure 3:
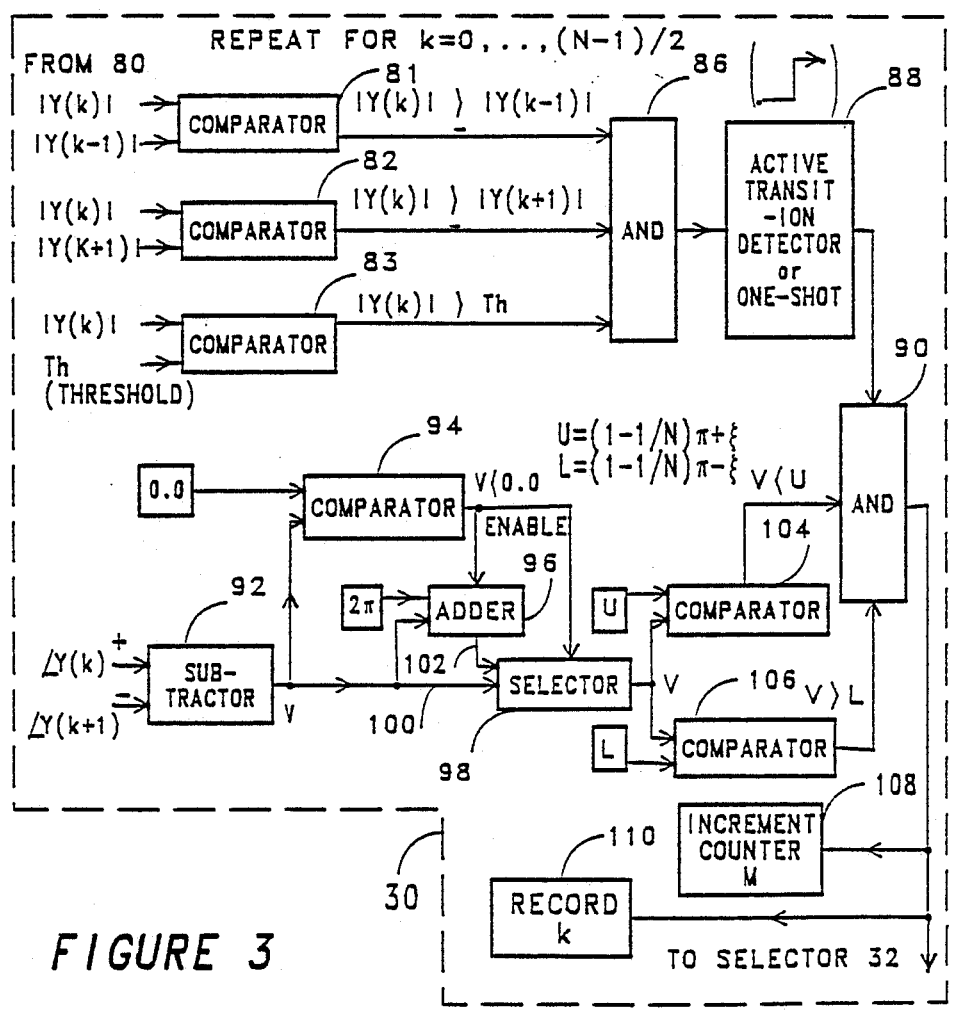
FIG. 3 shows a block diagram of a dominant spectral components detector forming part of the apparatus of FIG. 1.

A dominant spectral components detector 30 is connected to the buffer register 24, and processes the signal stored therein, to determine the dominant spectral components. The dominant spectral components detector is shown in detail in FIG. 3. As detailed below, two different techniques are combined, to determine the dominant spectral components.

Here, we use the convention: $|Y(k)|$ is the magnitude of $Y(k)$. As shown, there are inputs 80 for three comparators 81, 82 and 83. For each index k, the first comparator 81 is provided with $|Y(k)|$ and $|Y(k-1)|$. In the first comparator 81, these two quantities are compared, and a 1 signal transmitted, if $|Y(k)|$ is greater than or equal to $|Y(k-1)|$. Similarly, for the second comparator 82, the quantities $|Y(k)|$ and $|Y(k+1)|$ are supplied to the inputs. These two quantities are compared, and if $|Y(k)|$ is greater or equal to $|Y(k+1)|$, a one signal is sent. For the third comparator 83, the quantity $|Y(k)|$ and a threshold signal Th are supplied to the inputs. These two values are compared, and if $|Y(k)|$ is greater than the threshold value, a one signal is transmitted.

The outputs of the three comparators 81, 82, 83 are connected to an AND gate 86. The output of this AND gate 86 is connected to an active transition detector device 88, which responds to a positive going input. The output of the device 88 is in turn connected to one input of a final AND gate 90.

In use, it will be seen that the AND gate 86 only produces an output, when it has three positive inputs. For this, it is necessary that $|Y(k)|$ is greater than or equal to both $|Y(k-1)|$ and $|Y(k+1)|$ as well as being greater than a threshold level. In other words, this arrangement detects the presence of a local peak. Since the comparators 81, 82 will transmit a positive signal when $|Y(k)|$ is equal to $|Y(k-1)|$ and $|Y(k+1)|$, a plateau formed from a set of three or two equal values of $Y(k)$ could cause the AND gate to transmit two or three separate positive signals, indicative of separate peaks. In order to ensure that, for such a plateau, only one indication of a peak or maximum is given, the active transition detector unit 88 is included. Where one has two or three equal values of $|Y(k)|$ greater than the values of the two adjacent $Y(k)$ points, and the threshold value, then a positive signal will be transmitted by the AND gate 86, for such point. However, as the unit 88 only responds to a positive going input, it will only respond to the first maximum $|Y(k)|$ value, as this sends the input of the unit 88 positive. For subsequent equal values of $|Y(k)|$, the input of device 88 remains positive but is not subject to a positive going input, so no further signal will be transmitted from it.

Whilst the comparators are shown pocessing the quantities $|Y(k)|$, they could equally process $|Y(k)|^2$ as these are the actual values stored in the buffer register 24.

As a further check on the presence of the peak or maximum, indicative of a dominant spectral component, the arguments of the Y(k) values are used. Examination of equation 5 will show that the difference between the phases of adjacent Fourier Transform in the spectrum at dominant spectral components is equal to $(1-1/N)\pi$. This characteristic is used to determine the presence of a dominant spectral component.

A subtractor 92 has two inputs, to which the values of the argument of Y(k) and Y(k+1) are supplied. These two arguments are then subtracted to give the phase difference. It is possible that this phase difference is negative. For this reason, a comparator 94 is provided. In the comparator 94, the value of the phase difference V is compared with a 0 value. If the phase difference is positive, i.e. greater than 0, then no signal is transmitted from the comparator 94. If the phase difference V is negative, then a signal is transmitted from the comparator 94 to an adder 96 and to a selector 98. In the adder 96, the value $2\pi$ is added to the phase difference V, to make it positive. In the absence of a signal from the comparator 94, the selector 98 takes the phase difference V supplied to an input 100. When enabled by the comparator 94, the selector 98 takes a signal from the adder 96 at an input 102. The selected signal, representative of the phase difference is then transmitted to two final comparators 104 and 106.

The two comparators 104, 106 have two further inputs supplied with two values U and L, representative of upper and lower limits, these being given by the following equation.

$$U = (1 - 1/N)\pi + \xi$$

$$L = (1 - 1/N)\pi - \xi'$$

where $\xi = \xi' = 0.2$, or other chosen value. As indicated, the comparator 104 determines whether the phase difference signal is less than the upper limit, whilst the comparator 106 determines if the phase difference signal is greater than the lower limit. If these two conditions are met, then positive signals are transmitted from both comparators 104, 106, to the final AND gate 90. Accordingly, for a signal to be transmitted from the AND gate 90, it must receive an indication from the active transition detector 88 that the $|Y(k)|$ value is a maximum, and an indication from the two comparators 104, 106 that the phase difference meets the requirement for a dominant spectral component. With these conditions met, a positive signal is transmitted to an increment counter 108 and a recorder 110. The increment counter 108 counts the number of dominant spectral components detected, these being given the index M, whilst the recorder 110 records the k value of that dominant spectral component. Further, as indicated, the signal from the AND gate 90 is transmitted to selectors 32, 34 (FIG. 1).

It is to be appreciated that the two tests for a dominant spectral component need not both be used. For some applications, one could use just the magnitude text, whilst for other applications one could use the argument test.

On the basis of the k values of the dominant spectral components, the selector 32 selects the values of the square of the magnitude and the argument for the dominant spectral components. The square of the magnitude is transmitted to a square root circuit 33, which determines the magnitude of that component. The argument is transmitted to a phase difference obtainer 38. Simultaneously, the selector 34 selects the various Y(k) components of the shifted signal from the buffer register 28, corresponding to the dominant spectral components. These are then transmitted to an argument obtaining unit 36. In this unit 36, the arguments of the dominant spectral components are obtained. This is achieved in a similar manner to the derivation for the original signal, effected in the rectangular-to-polar converter 22, as shown by components 68, 70 in FIG. 2.

A subtraction unit 38 is then supplied with the arguments of the components of the original and the shifted signal for the dominant spectral components. These arguments are subtracted to give a set of phase difference value $\theta_i$.

These phase differences $\theta_i$ are then supplied to a frequency obtaining unit 40. This frequency obtaining unit 40 is shown in detail in FIG. 4. It has an input 120 which is connected to a comparator 122 and to an adder 124. Further, the input 120 is connected to a selector 126. The comparator 122 compares the phase difference value with a zero input. If the phase difference value is less than 0, then it sends a positive or enable signal to the adder 124 and the selector 126. The adder then takes the phase difference input, adds the value to $2\pi$ to it to make a positive value, and transmits the positive phase difference value to the selector 126. When enabled by the comparator 122, the selector 126 takes the signal at its input 128, and transmits this to a divider 132. When the original phase difference value is positive, no signal is sent by the comparator 122, and the selector then transmits the original phase difference value received at its input 130 to the divider 132. As detailed above, the phase difference $\theta_i$ is equal to $2\pi f_i rT$. Accordingly, in the divider 132, the phase difference is divided by the quantity $2\pi rT$, this value being stored in a unit 134. The output of the divider then gives the frequency for each sinusoid, namely $f_i$. The frequency values for all the dominant spectral components are then transmitted to an initial phase calculation unit 42 and an amplitude calculation unit 44.

Figure 5:
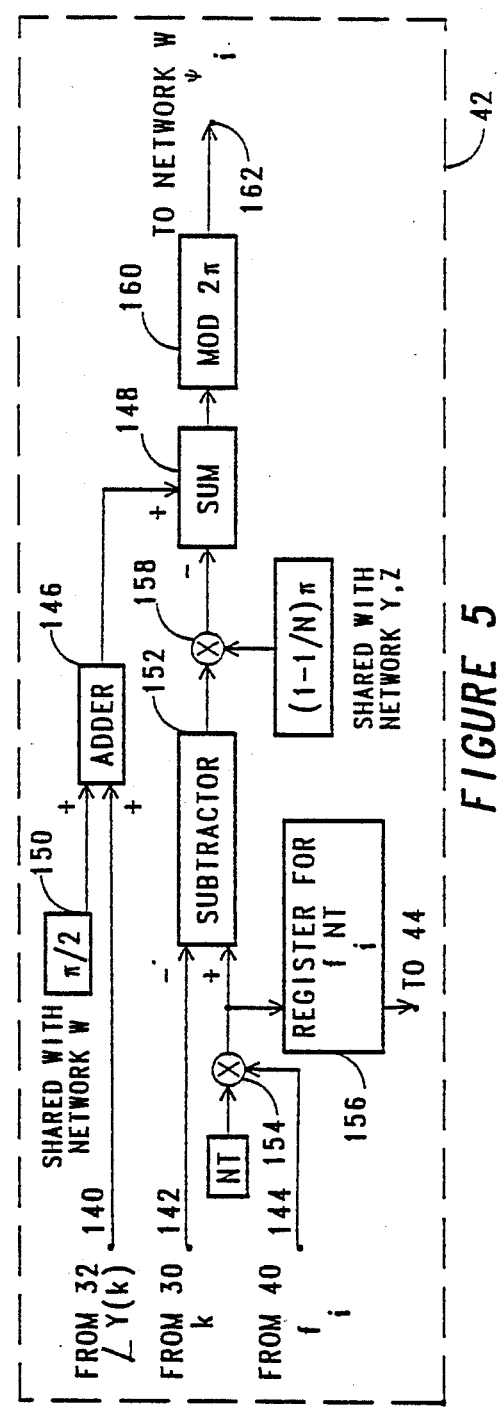
FIG. 5 shows a block diagram of an initial phase obtaining unit, forming part of the apparatus of FIG. 1.

The initial phase obtaining unit 42 is shown in detail in FIG. 5. It has three inputs 140, 142 and 144. These three inputs are connected respectively to: the selector 32 to receive the arguments of the dominant spectral components of the original signal; to the dominant spectral components detector 30, to receive the k indices corresponding to the dominant spectral components; and to the frequency obtaining unit 40, to receive the frequencies of the dominant spectral components. The input 140 is connected to an adder 146, in which a fixed value $\pi/2$ is added to the argument, and this sum is transmitted to a summation unit 148. Note that the fixed value of $\pi/2$ is provided from a device 150, which is common with a network W, described below. The second input 142 is connected to a subtraction unit 152. The third input 144 is connected to a multiplication unit 154, in which it is multiplied by a fixed value NT the resultant $f_i$NT is stored in a register 156, for use in the amplitude obtaining unit 44. This resultant is also transmitted to the subtractor 152, in which the corresponding k index is subtracted from it. The output of the subtractor 152 is transmitted to a multiplication device 158, in which it is multiplied by a value $(1-1/N)\pi$. The output of the multiplication unit 158 is also connected to the summation unit 148, in which it is subtracted from the output of the adder 146. It will be seen that the output of the summation unit 148 is: $\angle Y(k)+\pi/2-(1-1/N)\pi(f_i NT-k)$. It will be seen that this is the value of the initial phase, corresponds to equation 5. This value of the initial phase is passed through a modular $2\pi$ device 160, to give a positive initial phase in the range $(0,2\pi)$ at an output 162.

Turning to the amplitude obtaining unit 44, it will be seen that this unit comprises a number of individual networks X, Y and Z. These individual networks will be described, before a description is given of the whole amplitude obtaining unit 44.

Similar to equation 3, it can be shown that, at each dominant spectral component, there are from each sinusoid six elements making up that dominant spectral component, so that both the Hanning or Hamming window could be used. Each element has an amplitude derived by a respective network X, and an argument derived by a respective network Y or Z.

$\alpha = 0.54$ for Hamming window $\alpha = 0.50$ for Hanning window $\alpha = 1$ for rectangular window $$Y(k) = \frac{\alpha}{2} \sum_{i=1}^{M} A_i \left[ e^{j[2\pi f_i rT+\psi_i-\frac{\pi}{2}+(1-\frac{1}{N})\pi(f_i NT-k)]} \frac{\sin\pi(f_i NT - k)}{\sin\frac{\pi}{N}(f_i NT - k)} + \right.$$

$$e^{-j[2\pi f_i rT+\psi_i-\frac{\pi}{2}+(1-\frac{1}{N})\pi(f_i NT+k)]} \frac{\sin\pi(f_i NT + k)}{\sin\frac{\pi}{N}(f_i NT + k)} \Bigg] -$$

$$\frac{(1-\alpha)}{4} \sum_{i=1}^{M} A_i \left[ e^{j[2\pi f_i rT+\psi_i-\frac{\pi}{2}+(1-\frac{1}{N})\pi(1+f_i NT-k)]} \frac{\sin\pi(1 + f_i NT - k)}{\sin\frac{\pi}{n}(1 + f_i NT - k)} + \right.$$

-continued $$e^{j[2\pi f_i rT+\psi_i-\frac{\pi}{2}+(1-\frac{1}{N})\pi(-1+f_iNT-k)]} \frac{\sin\pi(-1+f_iNT-k)}{\sin\frac{\pi}{N}(-1+f_iNT-k)} +$$

$$e^{-j[2\pi f_i rT+\psi_i-\frac{\pi}{2}+(1-\frac{1}{N})\pi(-1+f_iNT+k)]} \frac{\sin\pi(-1+f_iNT+k)}{\sin\frac{\pi}{N}(-1+f_iNT+k)} +$$

$$e^{-j[2\pi f_i rT+\psi_i-\frac{\pi}{2}+(1-\frac{1}{N})\pi(1+f_iNT+k)]} \frac{\sin\pi(1+f_iNT+k)}{\sin\frac{\pi}{N}(1+f_iNT+k)} \Bigg]$$

This equation is the equation for the shifted signal. For the original signal, the term $2\pi f_i rT$, which equals $\theta_i$, is dropped or set to zero.

It can be seen from the above equation that, for a rectangular window only two elements from each sinusoid make up the spectral component and consequently the circuit could be considerably simplified for just a rectangular window. The amplitude obtaining unit 44 derives the values of the magnitude for each sinusoid making up the signal, as given by the following equation:

$$A_i = \frac{|Y(k)|}{|R|} \qquad \text{Eqn (9)}$$

where $$R = \frac{\alpha}{2}\Bigg[ e^{j[2\pi f_i rT+\psi_i-\frac{\pi}{2}+(1-\frac{1}{N})\pi(f_iNT-k)]} \frac{\sin\pi(f_iNT-k)}{\sin\frac{\pi}{N}(f_iNT-k)} +$$

$$e^{-j[2\pi f_i rT+\psi_i-\frac{\pi}{2}+(1-\frac{1}{N})\pi(f_iNT+k)]} \frac{\sin\pi(f_iNT+k)}{\sin\frac{\pi}{N}(f_iNT+k)} \Bigg] -$$

$$\frac{(1-\alpha)}{4}\Bigg[ e^{j[2\pi f_i rT+\psi_i-\frac{\pi}{2}+(1-\frac{1}{N})\pi(1+f_iNT-k)]} \frac{\sin\pi(1+f_iNT-k)}{\sin\frac{\pi}{N}(1+f_iNT-k)} +$$

$$e^{j[2\pi f_i rT+\psi_i-\frac{\pi}{2}+(1-\frac{1}{N})\pi(-1+f_iNT-k)]} \frac{\sin\pi(-1+f_iNT-k)}{\sin\frac{\pi}{N}(-1+f_iNT-k)} +$$

$$e^{-j[2\pi f_i rT+\psi_i-\frac{\pi}{2}+(1-\frac{1}{N})\pi(-1+f_iNT+k)]} \frac{\sin\pi(-1+f_iNT+k)}{\sin\frac{\pi}{N}(-1+f_iNT+k)} +$$

$$e^{-j[2\pi f_i rT+\psi_i-\frac{\pi}{2}+(1-\frac{1}{N})\pi(1+f_iNT+k)]} \frac{\sin\pi(1+f_iNT+k)}{\sin\frac{\pi}{N}(1+f_iNT+k)} \Bigg]$$

To further simplify the hardware for unit 44, the negative frequency element in equation 9 can be eliminated. Thus the networks $X_4$, $X_5$, $X_6$ and Z are eliminated from unit 44.

Figure 7:
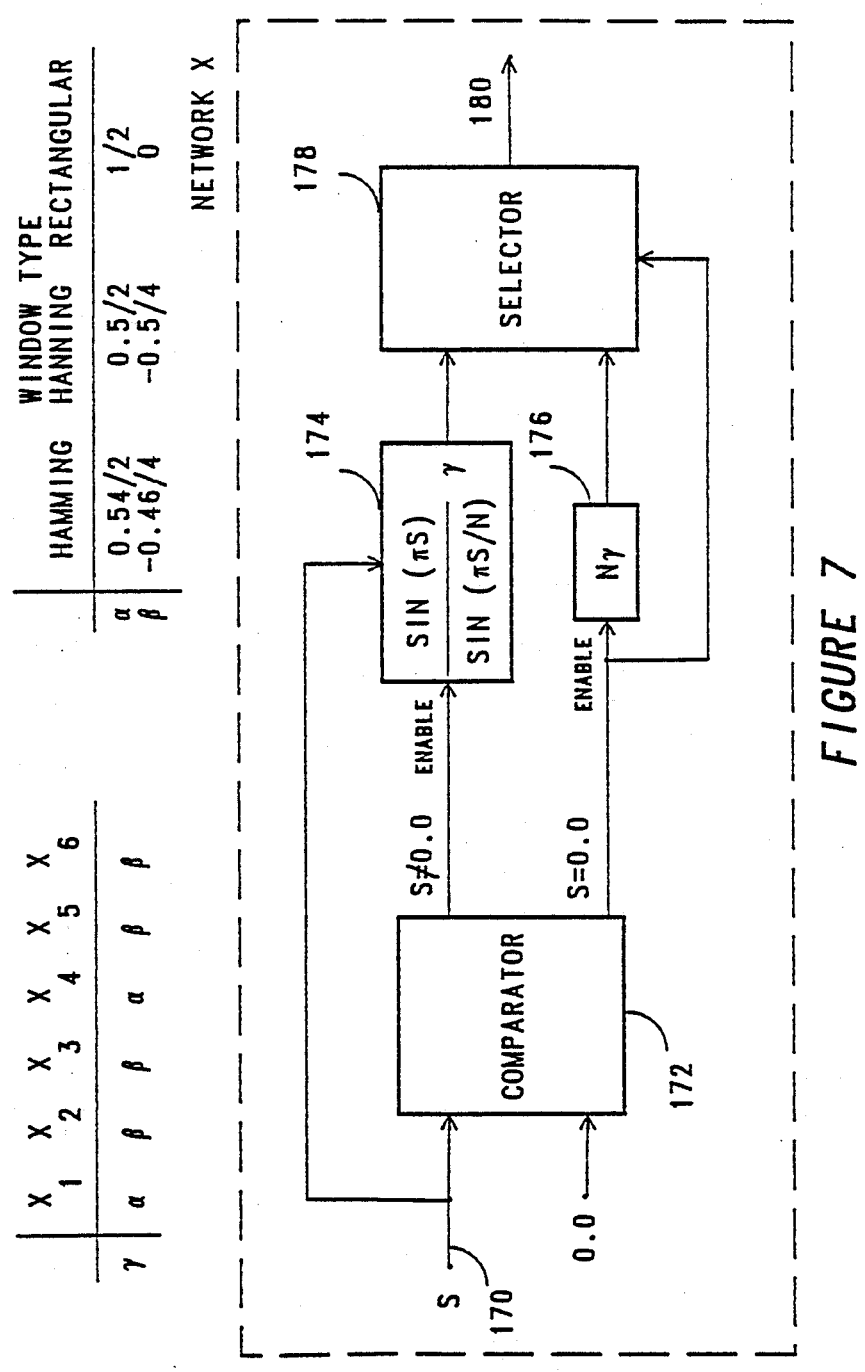
FIG. 7 shows a network forming part of the amplitude obtaining unit of FIG. 6.

Turning to FIG. 7, there is shown a schematic of a network X, together with tables indicative of the values of a coefficient $\gamma$, for the various different networks X. Each network X has an input 170, which receives a respective input signal S, as explained below for the amplitude obtaining unit 44. This input is connected to a comparator 172, which determines whether the input signal S is zero or not. The comparator 172 has two enabling outputs connected to a derivation unit 174 and a fixed value unit 176. The input signal S is also supplied to the derivation unit 174. When S does not equal 0, then the unit 174 is enabled, to determine the value of the function: $\gamma\sin(\pi S)/\sin(\pi S/N)$. When S is equal to 0, then the fixed value unit 176, is activated to provide a value determined from L'Hopital's rule. A selector 178 receives the outputs of the two units or devices 174, 176, together with an enabling signal; it selects the appropriate input signal and communicates this to an output 180, dependent upon the enabling signal. The value of the constant $\gamma$ is chosen in accordance with the two tables, the constant varying of different windows and for the six different networks X. By way of example, values are given for a rectangular window, and for Hanning and Hamming windows.

Figure 10:
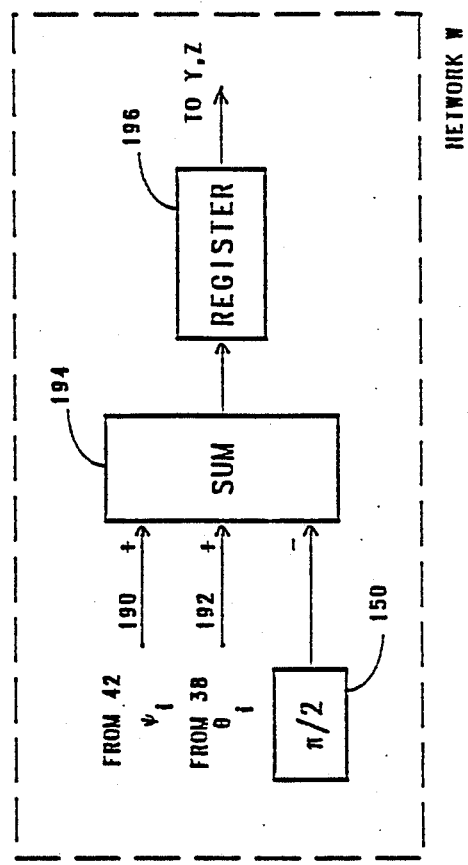
FIG. 10 shows the further network forming part of the amplitude obtaining unit of FIG. 6.

As each of the networks Y, Z requires one input which is common to the two networks, a separate network W is provided for obtaining this input signal. Network W is shown in FIG. 10. It has an input 190 for the initial phase obtained by the phase obtaining unit 42, for each of the dominant spectral components. It also has an input 192 for the phase difference signal $\theta_i$ although this would be omitted for the original signal. As mentioned above, a fixed value unit 150 containing the value $\pi/2$, common to the initial phase calculation unit 42, is also provided at an input. A summation unit 194 is connected to these three inputs, and sums the initial phase, the phase difference, and subtracts the fixed value $\pi/2$, to give output of: $\psi_i+\theta_i-\pi/2$. The values of this output for the different dominant spectral components are stored in a register 196, for use in the networks Y, Z.

The network Y is shown in FIG. 8. It has an input for the signal S, connected to a multiplication device 200. A fixed value device, supplies the value $(1-1/N)\pi$, to the multiplication device 200, The output of the device 200 is connected to a summation device or adder 202, where it is added with a corresponding output from the network W. This gives a signal P, and a device 204 determines the quantity $EXP(jP)$, which is transmitted to the output.

Referring to FIG. 9, which shows a network Z, the network Z is generally similar to the network Y, and like components are given the same reference. The adder 202 produces an output, which is denoted as Q. In a device 206, the quantity $EXP(-jQ)$ is determined.

Figure 6:
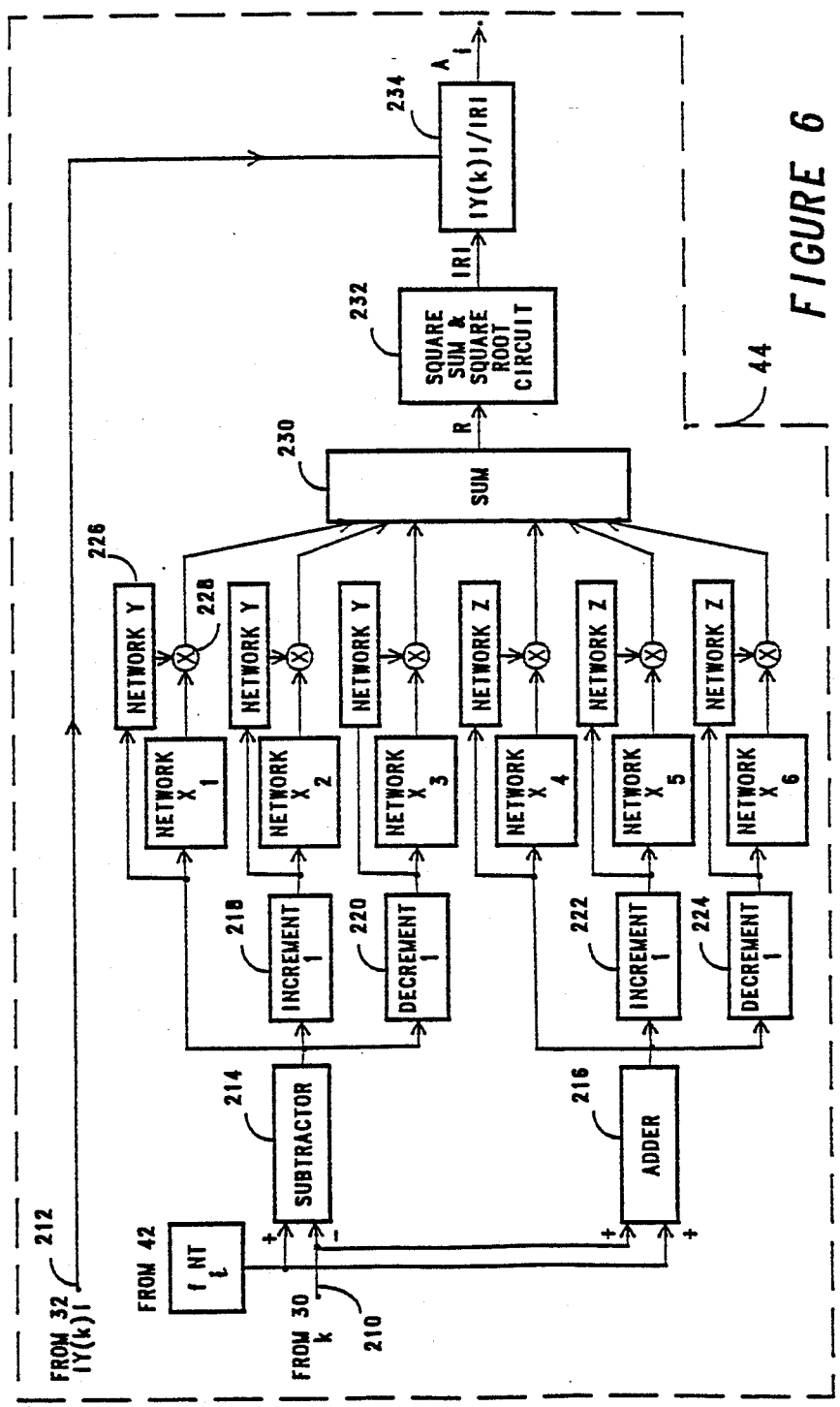
FIG. 6 shows a block diagram of an amplitude obtaining unit, forming part of the apparatus of FIG. 1.

Turning back to the amplitude obtaining unit 44 of FIG. 6, it will be seen that there are provided two inputs 210, 212 connected respectively to the dominant spectral components detector 30, and the selector 32. The input 210 is connected to both a subtractor 214 and an adder 216. A value $f_iNT$ stored in the register 156 is also connected to inputs of the subtractor 214 and adder 216. Consequently, the output of the subtractor 214 is $f_iNT-k$, whilst the output of the adder 216 is $f_iNT+k$.

The subtractor 214 and adder 216 are connected to respective increment and decrement units 218, 220, 222 and 224. The increment units 218, 222 add the quantity 1 to the received signal, whilst the decrement units 220, 224 subtract the quantity 1. The networks $X_1$, $X_4$ receive the outputs of the subtractor 214 and 216 directly. The networks $X_2$, $X_5$ receive the outputs of the increment units 218, 222 respectively, whilst the networks $X_3$, $X_6$ receive the outputs of the decrement units 220, 224. The networks Y, Z receive inputs corresponding to that received by their corresponding networks X. Since the networks X all behave similarly, and since the networks Y, Z also all behave similarly, a description will just be given of the operation of the network $X_1$ and associated network Y denoted by the reference 226.

The network $X_1$ and the network Y are connected to a multiplication unit 228. The network $x_1$ obtains the magnitude of the element of the transformed component; as explained above, the network $X_1$ receiving the input $f_iNT-k$. The network Y simultaneously obtains the argument for that element, as explained above. This argument and magnitude are then multiplied together by the multiplication device 228, to give a signal representative of that element of the transformed component. A summation unit 230 has inputs for all six elements making up the component of the transformed signal. These are summed, and the sum is transmitted as a signal R to a unit 232. Since the signal contains real and imaginary components, in the unit 232, these real and imaginary components are squared, summed and square rooted to obtain the magnitude of the signal R. This is transmitted to a dividing unit 234 which also receives the signal $|Y(k)|$. In the dividing unit 234, $|Y(k)|$ is divided by $|R|$ to give the amplitude of that dominant constituent.

A description will now be given of the other embodiments of the present invention shown in FIGS. 11, 12, 13 and 14 for measuring parameters of signal constituents. In these other embodiments of the present invention, many of the components are the same as in the first embodiment described above. These components are given the same reference numerals, and descriptions of them and their modes of operation are not repeated.

Figure 11:
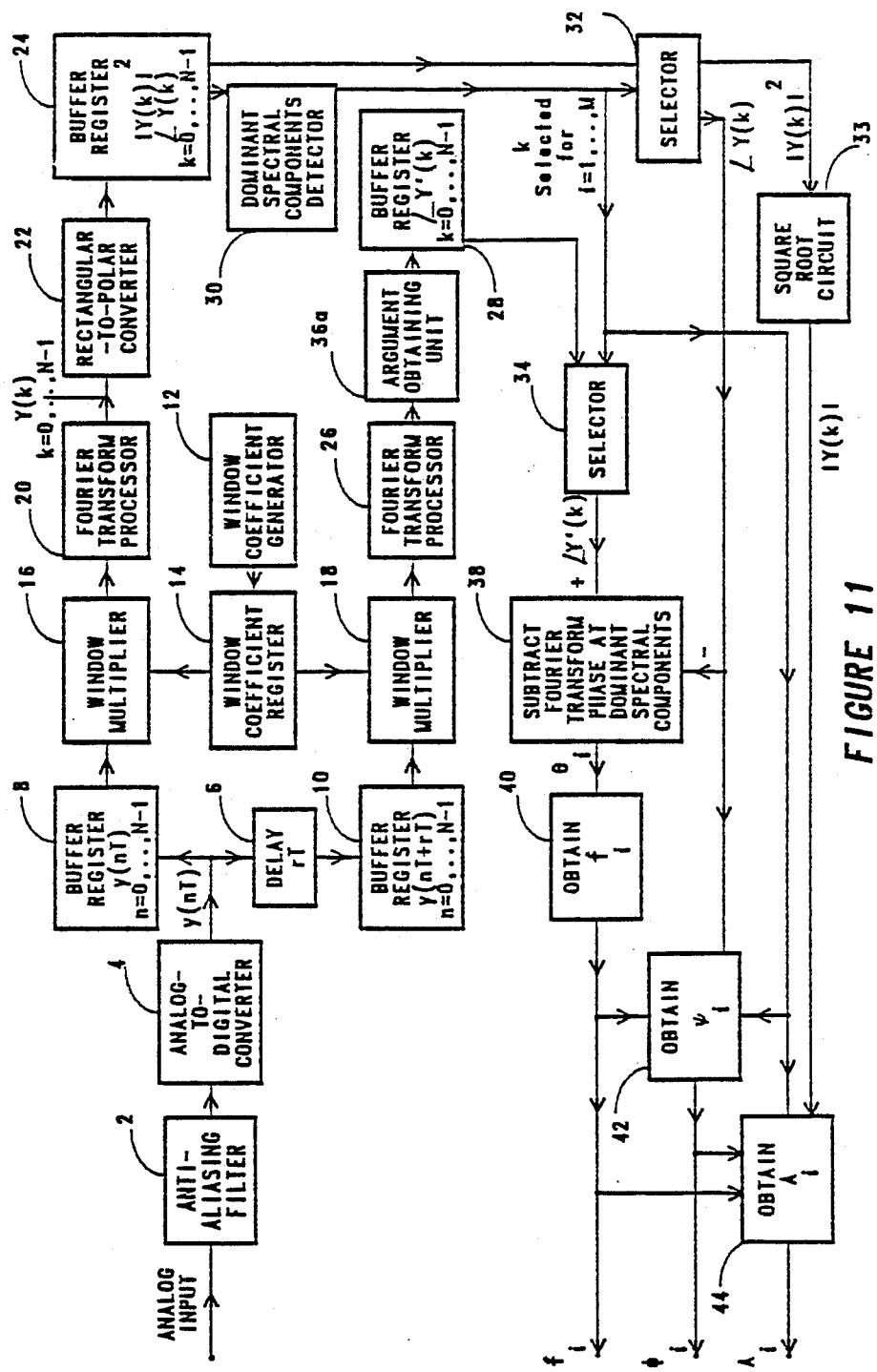
FIG. 11 shows a block diagram of a second embodiment of an apparatus in accordance with the present invention to measure the frequencies, initial phases and amplitudes of the signal constituents.

Turning to FIG. 11, there is shown a second embodiment, which includes an alternative way of obtaining the arguments of the shifted components and the phase differences. Here, the shifted signal processing line includes an argument obtaining unit 36a, which replaces the argument obtaining unit 36 of the first embodiment. This argument obtaining unit 36a is located immediately after the Fourier Transform processor 26. Consequently, the arguments of all the components will be obtained. These are then stored in the buffer register 28. The selector 34 then selects the arguments of the dominant spectral components, and these are supplied to the phase difference obtaining unit 38. This technique may have advantages in some circumstances, although it does require the derivation of some redundant values, namely the argument of the components which are not dominant spectral components. Otherwise, the reminder of this embodiment functions as the first embodiment.

Figure 12:
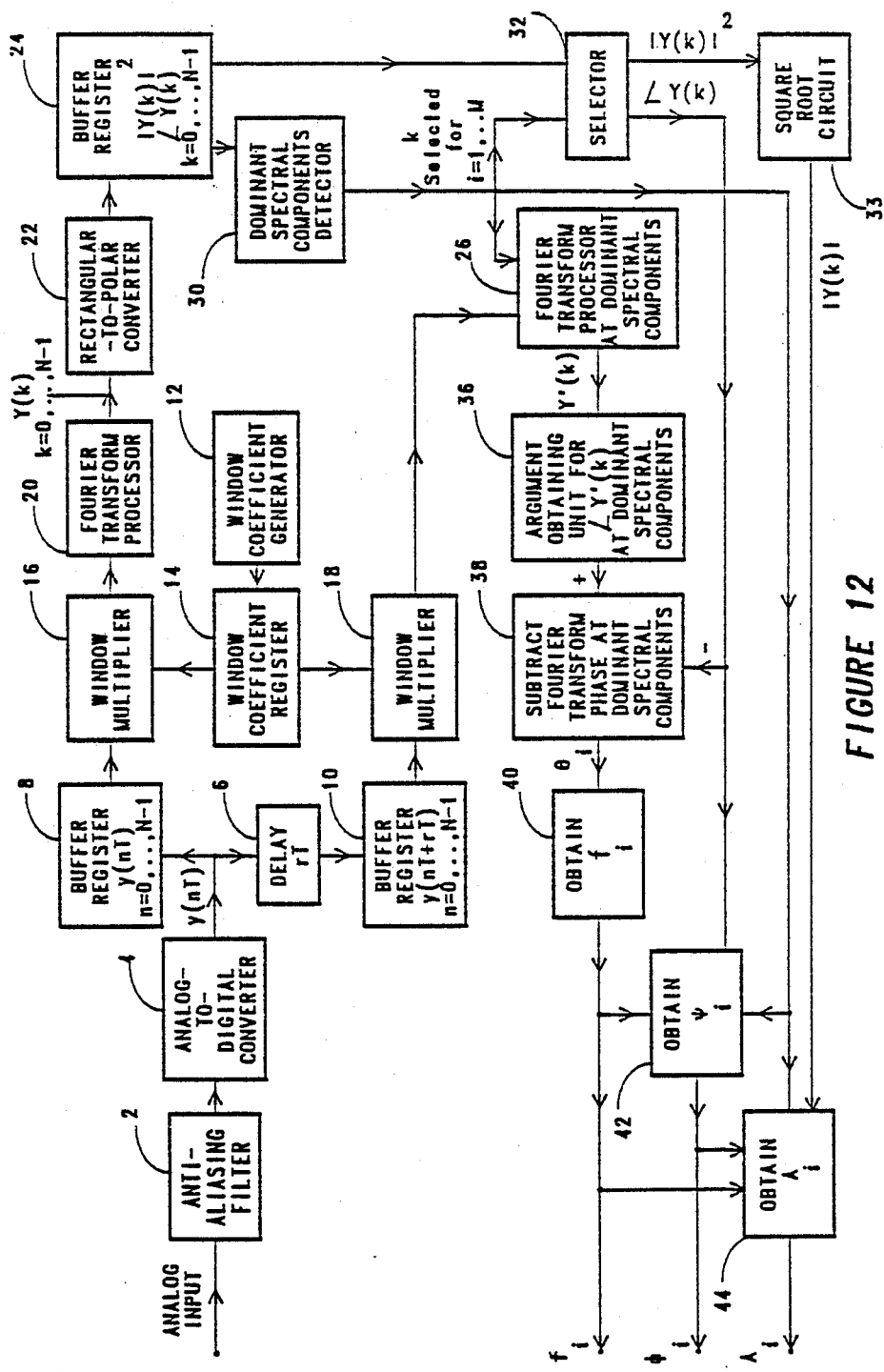
FIG. 12 shows a block diagram of a third embodiment of an apparatus in accordance with the present invention to measure the frequencies, initial phases and amplitudes of the signal constituents.

With reference to FIG. 12, in this third embodiment, the Fourier Transform processor 26 is connected to the output of the dominant spectral components detector 30. The buffer register 28 and selector 34 of the first embodiment are omitted. The Fourier Transform processor 26 is controlled by the dominant spectral components detector, so as to only obtain the Fourier Transform of the dominant spectral components. These Fourier Transforms are transmitted to the argument obtaining unit 36, in which the respective arguments are obtained. Otherwise, again this circuit functions as for the first embodiment.

As mentioned above, the signal sample taken is of finite length. In effect, a finite signal represents a signal which has already been subjected to a rectangular window. This characteristic can be used to simplify the circuit. One simply takes the finite signal sample available, and operates on this, without subjecting it to a window function. This enables the elimination of the components necessary for producing and applying the window function, namely the components 12, 14, 16 and 18 of FIG. 1.

Figure 13:
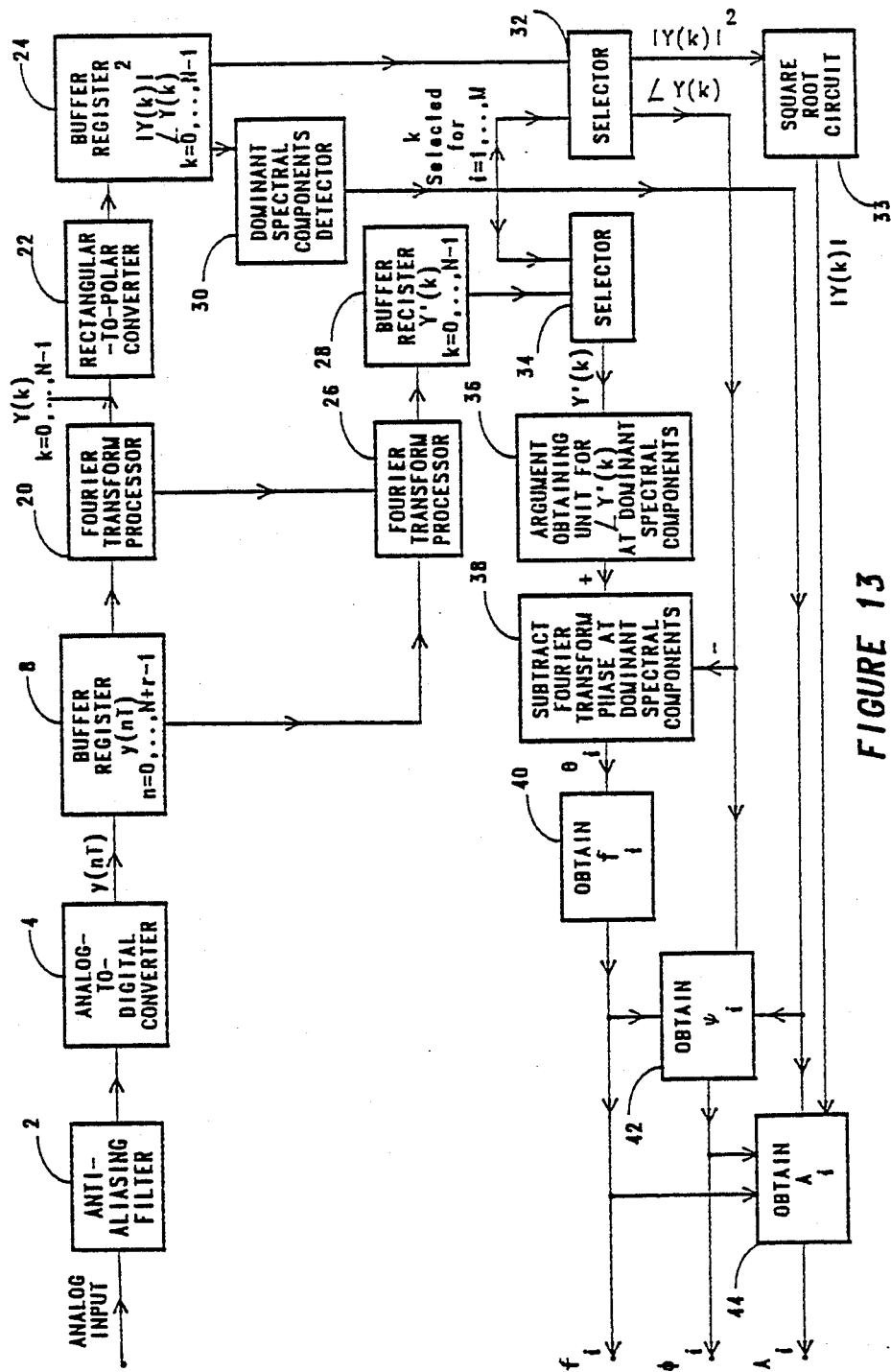
FIG. 13 shows a diagram of a fourth embodiment of an apparatus in accordance with the present invention to measure the frequencies, initial phases and amplitudes of the signal constituents.
Figure 14:
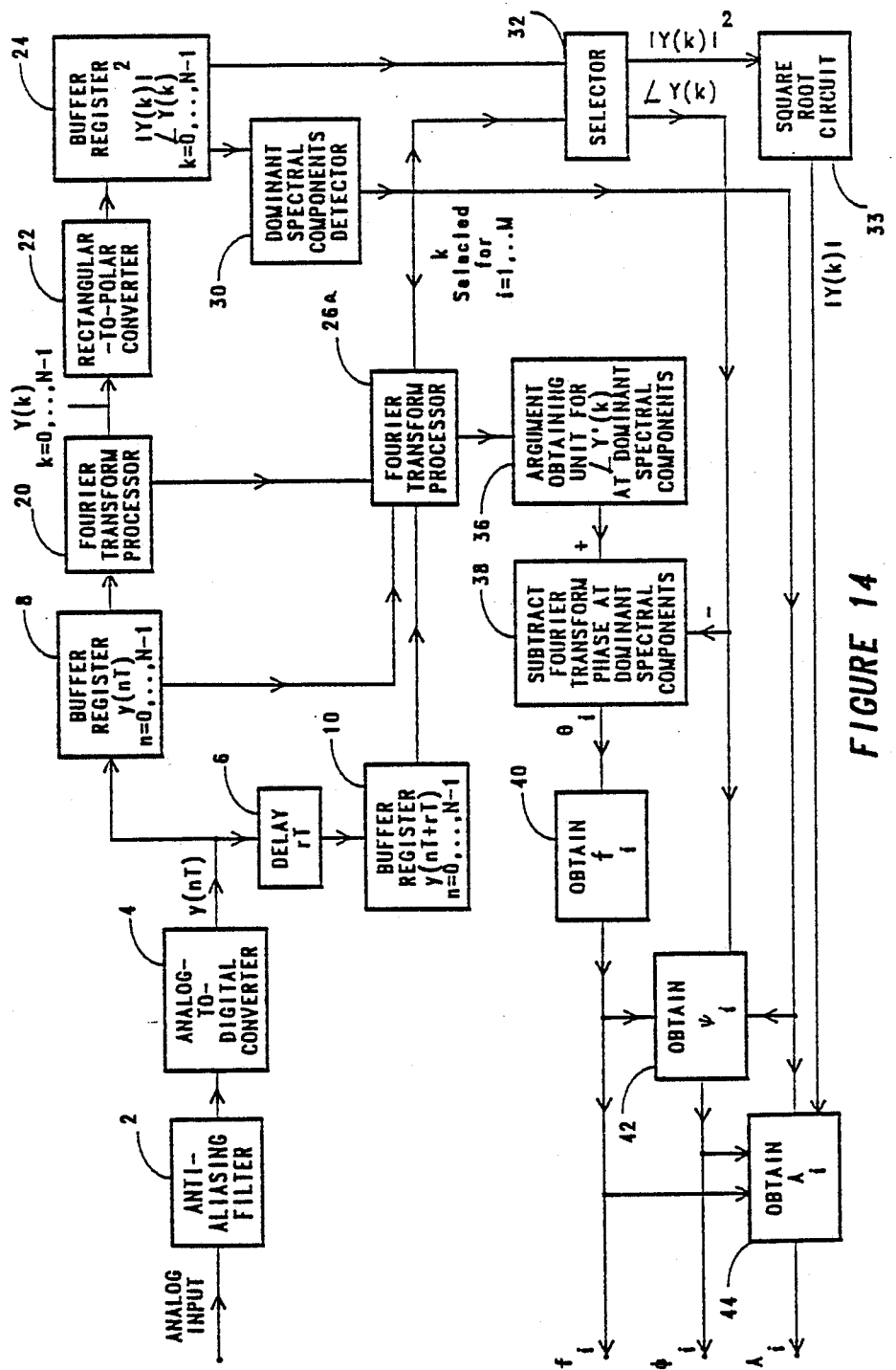
FIG. 14 shows a block diagram of a fifth embodiment of an apparatus in accordance with the present invention to measure the frequencies, initial phases and amplitudes of the signal constituents.

With reference to FIG. 13, there is shown an apparatus including a single input buffer register 8. The signal sample available is considered to be a signal having n samples where $n=0,\ldots,N+r-1$. This signal sample is broken up to form an original signal, and a shifted signal. The signal samples in the range $n=0,\ldots,N-1$ are treated as the original signal, whilst the signal samples in the range $n=r,\ldots,N+r-1$ are treated as the shifted signal.

It will be noted that these two signals overlap. This fact is used, to eliminate unnecessary duplication in the Fourier Transform calculation. The first Fourier Transform processor obtains the Fourier Transforms for the original signal. The Fourier Transform processor 26 utilizes this first transform to reduce the time needed to get the transform of the shifted signal. Thus, from the buffer register 8, the signal samples in the non-overlap range are sent to the Fourier Transform processor 26, and the Fourier Transform of the relevant parts of the original signal are sent from the first Fourier Transform processor 20 to the second Fourier Transform processor 26. Again, this third embodiment otherwise operates as for the first embodiment.

Finally, turning to the fourth embodiment of the apparatus shown in FIG. 14, again the overlap between the original and shifted signals is utilized, to reduce the operations required. Here, the time delay rT is again applied to obtain a shifted signal. However, it is only applied to part of the original signal, and in the buffer register 10 only the additional values of the shifted signal are stored, which do not overlap the original signal. Again, like the third embodiment of FIG. 12, there is a Fourier Transform processor 26a, for just obtaining the Fourier Transform of the dominant spectral components. To reduce the effort required, it is supplied with the Fourier Transform of the original signals from the Fourier Transform processor 20. Additionally, the non-overlapping samples from the original and shifted signals are supplied from the buffer register 8, and the additional samples of the shifted signal are sent from the buffer register 10. Otherwise, this circuit functions as described for the first and third embodiments.

By way of example, reference will now be made to FIGS. 15–22, which show an application of the method and apparatus of the present invention.

FIGS. 15–19 show a simulation carried out using the parameters listed in the following table 1.

TABLE 1

A SET OF INPUT DATA FOR SIMULATION

Frequency bin size = 1/NT = 10000 Hz/512 = 19.531 [Hz]
Sampling frequency = 1/T = 10000 [Hz]
N = 512
M = 5

| i | $A_i$ | $f_i$ [Hz] | $f_i NT$ [Cycles] | $\psi_i$ [rad] |
|---|---|---|---|---|
| 1 | 1.00 | 9.76563 | 0.5 | 2.00 |
| 2 | 1.00 | 107.42188 | 5.5 | 2.00 |
| 3 | 1.00 | 400.39063 | 20.5 | 2.00 |
| 4 | 1.00 | 1005.85938 | 51.5 | 2.00 |
| 5 | 1.00 | 3994.14063 | 204.5 | 2.00 |

The frequencies were selected, such that they have different distances between adjacent sinusoids. Also, the frequency locations are all at the middle of frequency bins, so that all the local maxima of the side lobes of the window spectrum can be captured. In other words, maximum spectral leakage is displayed in the spectrum. The signal was processed by the outline above, using a Hanning window, and r equals to 1. The results of the simulation are given in the following table 2.

TABLE 2

SIMULATION RESULT
Hanning window used
No additive noise
r = 1

| | | Estimated values | | | Error in $f_i$ |
|---|---|---|---|---|---|
| i | k | $A_i$ | $f_i$ [Hz] | $\psi_i$ [rad] | estimation [Hz] |
| 1 | 1 | 0.84551 | 12.59449 | 1.71574 | −2.82887 |
| 2 | 5 | 0.98380 | 106.75054 | 2.10881 | 0.67134 |
| 3 | 20 | 0.99746 | 400.31091 | 2.01578 | 0.07972 |
| 4 | 52 | 0.99946 | 1005.87769 | 1.99392 | −0.01832 |
| 5 | 205 | 0.99995 | 3994.15430 | 1.99439 | −0.01368 |

FIG. 15 shows a graph of the original signal, given by the parameters of Table 1. FIG. 16 shows a graph of the resynthesized signal, according to the parameters given in Table 2. FIG. 17 shows the error waveform, on a larger scale. Two additional spectra or graphs are plotted in FIGS. 18 and 19; the first one is obtained from the original signal, whilst the second one in FIG. 19 is obtained from the estimation error waveform From the Table 2, we can see that the method obtained five dominant spectral constituents, corresponding generally closely to the original constituents of the original input signal. We can see that the main error in this resynthesized signal is from the estimation of the lower frequencies. This is apparent from the error waveform in FIG. 17, and also the error waveform spectrum in FIG. 19. The two lower frequencies are close together, so that the frequency estimations are more influenced by spectral leakage. In addition, they have less separation from their own negative frequencies than other higher spectral components. Higher net interferences therefore exist in these lower frequencies.

FIGS. 20–22 show an application on speech signal, the measured parameters are listed in Table 3. FIG. 20 shows the original speech signal. FIG. 21 shows the resynthesized speech signal using the measured parameters as listed in Table 3. From FIG. 22, it can be seen that the resynthesis using a small number of signal parameters can generate a speech signal which maintain the original quality.

TABLE 3

SPEECH SIGNAL
Male, 'a' as in fa'ther
Hanning window used
Sampling Frequency = 10,000 Hz
Measured values

| i | k | $A_i$ | $f_i$ [Hz] | $\psi_i$ [rad] |
|---|---|---|---|---|
| 1 | 0 | 0.03518 | 0.00000 | 1.57080 |
| 2 | 5 | 0.08248 | 102.10539 | 2.16916 |
| 3 | 10 | 0.15592 | 204.49055 | 4.56637 |
| 4 | 16 | 0.07857 | 306.51309 | 0.76829 |
| 5 | 21 | 0.10067 | 409.21149 | 2.77156 |
| 6 | 26 | 0.08460 | 511.79752 | 5.37050 |
| 7 | 31 | 0.27394 | 613.38721 | 0.36576 |
| 8 | 37 | 0.18427 | 715.60724 | 1.12666 |
| 9 | 42 | 0.06280 | 817.71460 | 1.70770 |
| 10 | 47 | 0.08085 | 920.25787 | 5.23502 |
| 11 | 55 | 0.04115 | 1071.56738 | 4.66432 |

It is to be appreciated that the above description of the various embodiments of the apparatus and method are for an application in which one wishes to know the dominant spectral components of an unknown signal. This basic technique can be varied in numerous ways.

Whilst the above technique uses simultaneous processing of the original signal and a shifted signal, this is not always necessary. In some circumstances, it may be acceptable to use sequential processing. In this case, the original signal would be processed first, and then the shifted signal. In this case, one can eliminate much of the hardware or operations needed for the shifted signal.

Further, for example, in the phase obtaining unit 42, it may sometimes be desirable to operate on the argument of the shifted signal. In this case, the summation unit 148 should include an input for a quantity representative of the phase difference $2\pi f_i rT$.

Whilst the technique has been described as applied to a time-varying signal, it could be applied to a signal which varies in dependence upon another parameter, such as distance. Also, it is not always necessary to look for the dominant spectral components. In some circumstances, one may be interested in simply knowing the characteristics of a small part of the frequency spectrum. This can be selected.

In the case of components comprising complex exponential functions, the equation can be written as $$y(nT) = \sum_{i=1}^{M} A_i e^{j(2\pi f_i nT + \psi_i)} + A_0$$

process involved in finding $f_i$ and $\psi_i$ are identical to those for sinusoids. As for the evaluation of $A_i$, the phasors for the negative frequencies in equation 3, 8 and 9 are eliminated, reducing the number of terms by half.

The way to distinguish sine components from the complex exponential components is that for sine components there are corresponding magnitude peaks at both the positive and the negative frequencies of the transformed signal. Whereas exponential components have only one magnitude peak either at the positive frequency or at the negative frequency depending on sign of the exponent.

For multi-dimensional signal analysis, the process is in parallel of the one-dimensional signal analysis.

For time delay measurement, the term, rT, in Equation 2 is replaced by a continuous real variable $t_{d,i}$. The time delay of each signal constituent in a received signal can be different when the received signal is a composite signal from difference sources. The phase difference of Equation 5 and Equation 7 is equal to $2\pi f_i t_{d,i}$, $f_i$ of which is known. Hence, the time delay of two received signals can be measured by using the phase difference.

A description will now be given of the other embodiments of the present invention shown in FIGS. 23, 25 and 26 for measuring time delays. In these other embodiments of the present invention, many of the components are the same as in the first embodiment described above. These components are given the same reference numerals, and descriptions of them and their modes of operation are not repeated.

Figure 23:
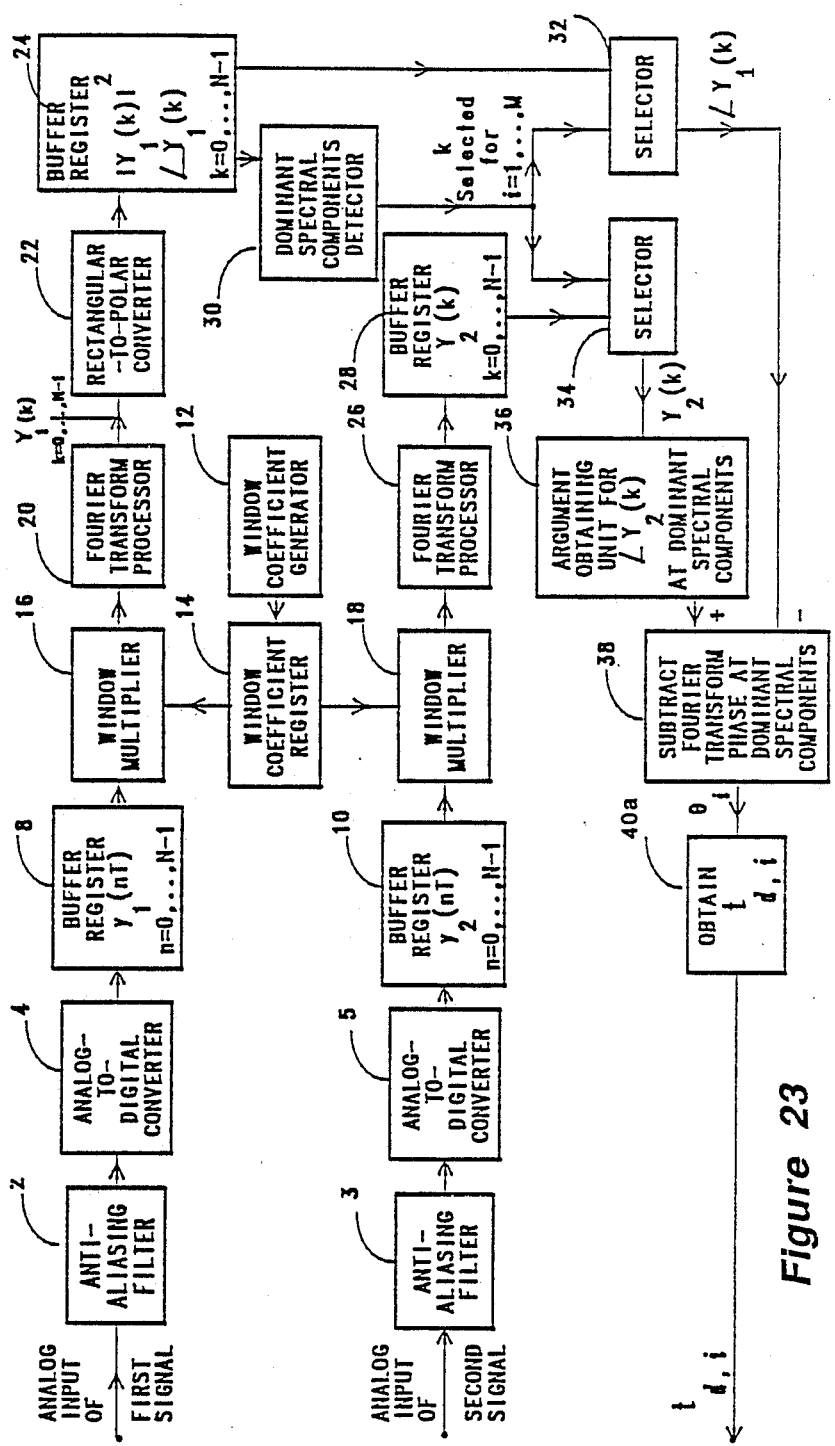
FIG. 23 shows a block diagram of a sixth embodiment of an apparatus in accordance with the present invention to measure the time delay.

Turning to FIG. 23, there is shown a sixth embodiment for time delay measurement, which includes essentially most of the components as shown in FIG. 1, except that the shifted signal is an input signal, therefore no delay unit is required to generate the shifted signal. The other difference is that unit 40 is replaced by unit 40a which is used to obtain the amount of time shift $t_{d,i}$. When the frequencies associated with the time-shifted sinusoids are confidently known, there is no need to measuring the frequencies nor to detect the dominant spectral components. However, FIG. 23 describes an embodiment with the existence of dominent spectral component detector for the purpose of capturing any unknown dominant spectral component, or verifying the known frequencies. If there is no need to detect dominant spectral components, k's are known parameters instead of output from 30, and only the phase angles of the frequency components in the polar coordinates need to be obtained from the rectangular-to-polar converter.

Figure 4:
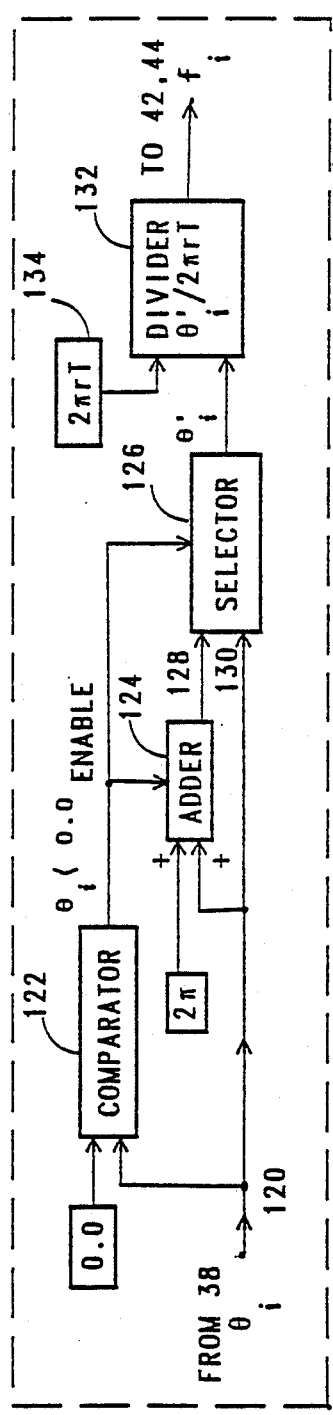
FIG. 4 shows a block diagram of a frequency obtaining unit, forming part of the apparatus of FIG. 1.
Figure 24:
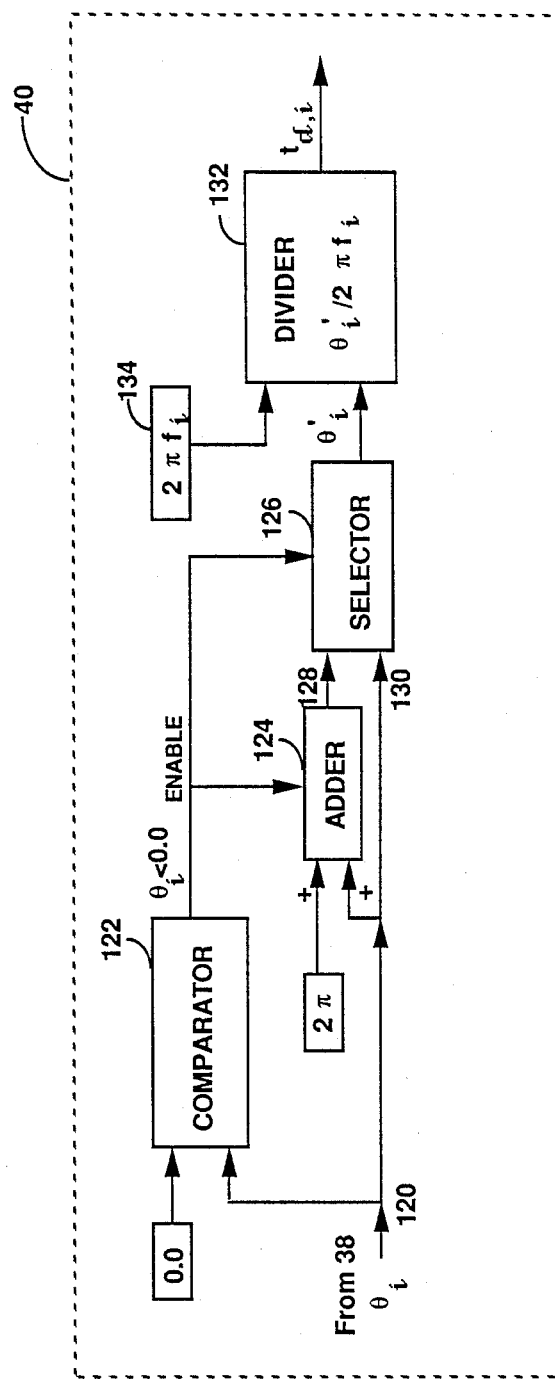
FIG. 24 shows a block diagram of a time delay obtaining unit, forming part of the apparatus of FIG. 23.

FIG. 24 shows an implementation of unit 40a, in which the components are essentially the same as those in FIG. 4, except that the unit 134a stores the quantity $2\pi f_i$. As detailed above, the phase difference $\theta_i$ is equal to $2\pi f_i t_{d,i}$. Accordingly, in the divider 132, the phase difference is divided by the quantity $2\pi f_i$, this value being stored in a unit 134a. The output of the divider then gives the time-shift for each sinusoid, namely $t_{d,i}$.

Figure 25:
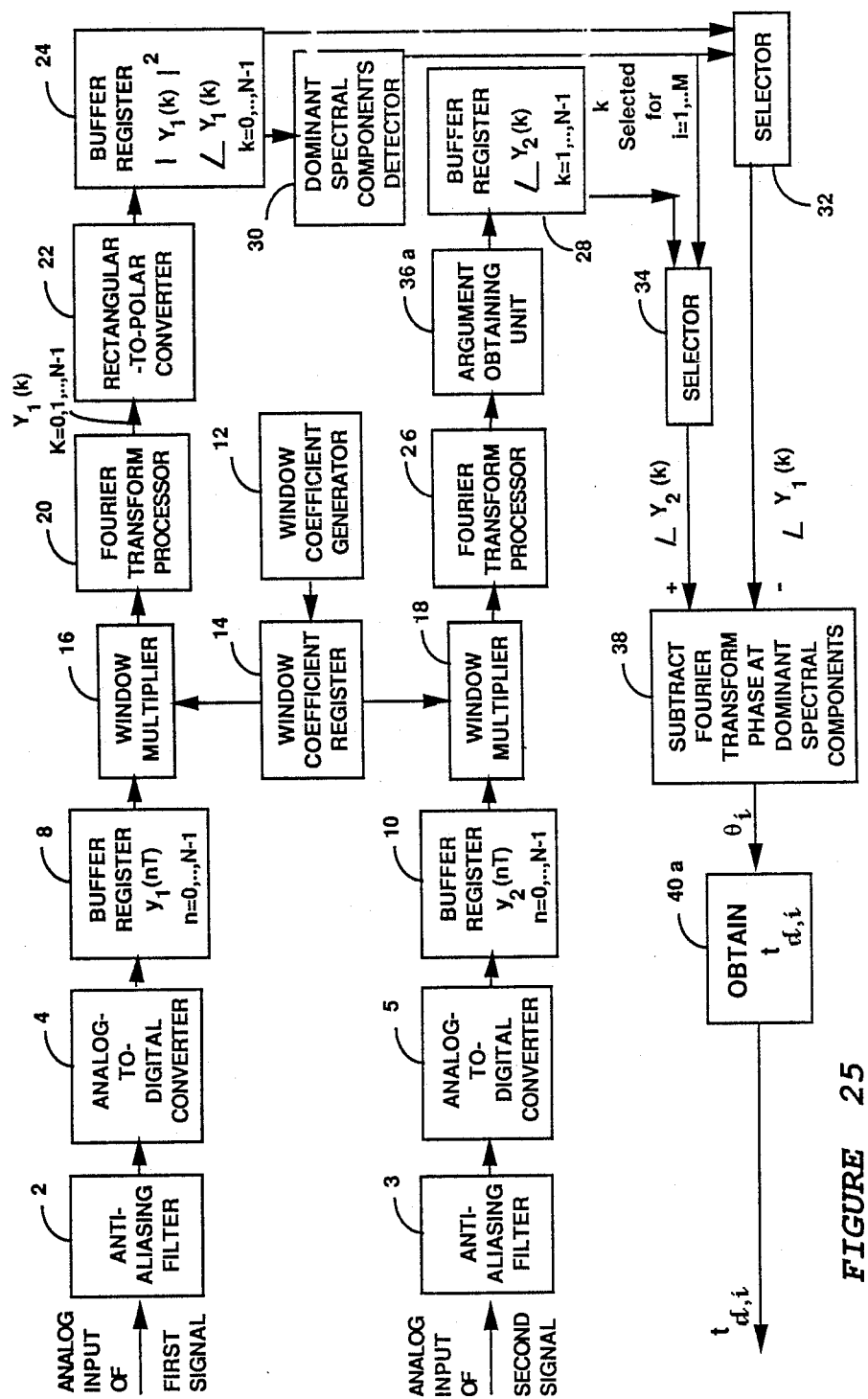
FIG. 25 shows a block diagram of a seventh embodiment of an apparatus in accordance with the present invention to measure the time delay.

Turning to FIG. 25, there is shown a seventh embodiment, which includes an alternative way of obtaining the arguments of the time-shifted components and the phase differences as in the second embodiment. Here, the time-shifted processing line includes an argument obtaining unit 36a, which replaces the argument obtaining unit 36 of the sixth embodiment. This argument obtaining unit 36a is located immediately after the Fourier Transform processor 26. Consequently, the arguments of all the components will be obtained. These are then stored in the buffer register 28. The selector 34 then selects the arguments of the dominant spectral components, and these are supplied to the phase difference obtaining unit 38. This technique may have advantages in some circumstances, although it does require the derivation of some redundant values, namely the argument of the components which are not dominant spectral components. Otherwise, the reminder of this embodiment functions as the sixth embodiment.

Figure 26:
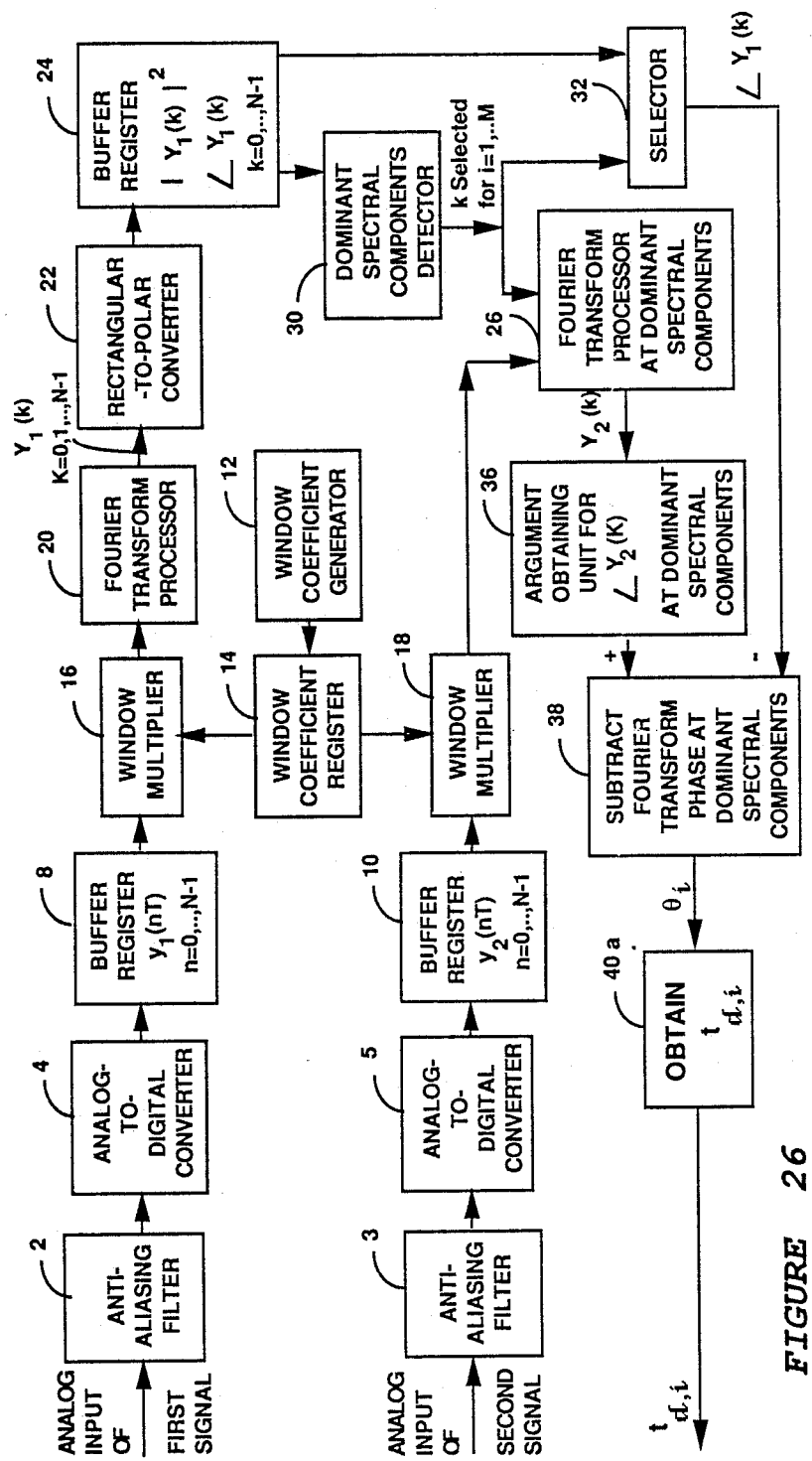
FIG. 26 shows a block diagram of a eighth embodiment of an apparatus in accordance with the present invention to measure the time delay.

With reference to FIG. 26, in this eighth embodiment which is similar to the third embodiment, the Fourier Transform processor 26 is connected to the output of the dominant spectral components detector 30. The buffer register 28 and selector 34 of the sixth embodiment are omitted. The Fourier Transform processor 26 is controlled by the dominant spectral components detector, so as to only obtain the Fourier Transform of the dominant spectral components. These Fourier Transforms are transmitted to the argument obtaining unit 36, in which the respective arguments are obtained. Otherwise, again this circuit functions as for the sixth embodiment.

Finally, whilst the described apparatus has been shown as different function units or clarity, these could be combined in various ways and implemented in one device or unit. The functions could be implemented, for example, optically or electronically. The devices can be analogue or digital.

It is expected that this technique could be applied to the decomposition or analysis of numerous signals, such as vibration signals. Such analysis makes it much easier to store data representative of the signal. Instead of having to store numerous sample points of the signal, one need simply store the amplitude, frequency and initial phase values for the dominant spectral constituents. This reduction in the data required to define a signal also facilitates transmission of the signal, and can be used to clean out or eliminate background noise.

The technique can be applied to relatively short signal samples, and still obtain accurate results. It is anticipated that this may well enable Modems to handle a larger amount of data.

I claim:

1. A method of measuring the frequency of the respective constituents of an analysed signal, the method comprising the steps of:
   (i) obtaining signal samples corresponding to the discrete spectral components of the analysed signal on a first basis set to create a plurality of first spectral components respective of the said analysed signal;
   (ii) separately applying a shift to the said analysed signal to create a shifted signal;
   (iii) obtaining signal samples corresponding to the discrete spectral components of the said shifted on a second basis set to create a plurality of second spectral components representative of the said shifted signal;

(iv) obtaining at least one pair of signal samples corresponding to the phases of the first and second spectral components;

(v) subtracting said signal samples corresponding to the phases of the first and second spectral components, to derive a signal sample corresponding to the phase difference; and (vi) obtaining the frequency of the corresponding constituent of the analysed signal from the said phase difference derived in step (v) and the amount of shift applied to step (ii).

2. A method as claimed in claim 1, wherein the said first and second spectral components in steps (i) and (iii) are obtained by means of Fourier Transform.

3. A method of measuring the frequency of the respective dominant constituents of an analysed signal, the method comprising the steps of:

(i) obtaining signal samples corresponding to the discrete spectral components of the analysed signal on a first basis set to create a plurality of first spectral components representative of the said analysed signal;

(ii) separately applying a shift to the said analysed signal to create a shifted signal;

(iii) obtaining signal samples corresponding to the discrete sspectral components of the said shifted signal on a second basis set to create a plurality of second spectral components representative of the said shifted signal;

(iv) selecting the dominant spectral components, corresponding to the dominant constituents of the analysed signal from the first spectral components or the second spectral components, the subsequent steps being effected on the dominant spectral components;

obtaining at least one pair of signal samples corresponding to the phases of the first and second spectral components;

(v) subtracting said signals samples corresponding to the phases of the first and second spectral components, to derive a signal sample corresponding to the phase difference; and (vi) obtaining the frequence of the corresponding constituent of the analysed signal from the said phase difference derived in setp (v) and the amount of shift applies to setp (ii).

4. A method claimed in claim 3, wherein the said signal samples corresponding to the first and second spectral components in steps (i) and (iii) are obtained by means of Fourier Transform.

5. A method as claimed in claim 1, 3, 2 or 4, which includes the additional step:

(vii) obtaining the initial phase of the respective signal constituents from the frequency of the signal constituent and the phase of the corresponding spectral component.

6. A method as claimed in claim 5, which includes the additional step:

(viii) obtaining the corresponding magnitude of at least the first spectral components or the second spectral components, and obtaining the amplitude of the respective signal constituent from the magnitude of the corresponding spectral component, and the frequency and initial phase of the respective signal constituents.

7. A method as claimed in claim 1, 3, 2 or 4, wherein the said step (vi) comprises for each said spectral component: making the respective phase difference modular and positive with respect to $2\pi$; and dividing the said phase difference by $2\pi$ and by the amount of shift applied to the shifted signal in step (ii), to give the frequency of the respective constituent.

8. A method as claimed in claim 5, wherein said step (vii) comprises for each said spectral component: obtaining the phase thereof and adding the value $\pi/2$ to obtain a first value; multiplying the respective frequency by the duration of the window applied to the signal, subtracting the corresponding index, and multiplying the resultant by a quantity $(1-1/N)\pi$ to obtain a second value; subtracting the second value from the first value, and making the resultant modular with respect to $2\pi$, to give the initial phase of the respective signal constituents.

9. A method as claimed in claim 6, wherein said step (viii) comprises, for each said spectral component, obtaining the amplitude of the respective signal constituent, $A_i$, by evaluating:

$$A_i = \frac{|Y(k)|}{|R|}$$

where $$R = \frac{\alpha}{2}\left[e^{j[2\pi f_i rT+\psi_i-\frac{\pi}{2}+(1-\frac{1}{N})\pi(f_iNT-k)]}\frac{\sin\pi(f_iNT-k)}{\sin\frac{\pi}{N}(f_iNT-k)} + \right.$$

$$\left. e^{-j[2\pi f_i rT+\psi_i-\frac{\pi}{2}+(1-\frac{1}{N})\pi(f_iNT+k)]}\frac{\sin\pi(f_iNT+k)}{\sin\frac{\pi}{N}(f_iNT+k)}\right] -$$

$$\frac{(1-\alpha)}{4}\left[e^{j[2\pi f_i rT+\psi_i-\frac{\pi}{2}+(1-\frac{1}{N})\pi(1+f_iNT-k)]}\frac{\sin\pi(1+f_iNT-k)}{\sin\frac{\pi}{N}(1+f_iNT-k)} + \right.$$

$$e^{j[2\pi f_i rT+\psi_i-\frac{\pi}{2}+(1-\frac{1}{N})\pi(-1+f_iNT-k)]}\frac{\sin\pi(-1+f_iNT-k)}{\sin\frac{\pi}{N}(-1+f_iNT-k)} +$$

$$e^{-j[2\pi f_i rT+\psi_i-\frac{\pi}{2}+(1-\frac{1}{N})\pi(-1+f_iNT+k)]} \frac{\sin\pi(-1+f_iNT+k)}{\sin\frac{\pi}{N}(-1+f_iNT+k)} +$$

$$e^{-j[2\pi f_i rT+\psi_i-\frac{\pi}{2}+(1-\frac{1}{N})\pi(1+f_iNT+k)]} \frac{\sin\pi(1+f_iNT+k)}{\sin\frac{\pi}{N}(1+f_iNT+k)} \Bigg]$$

10. A method as claimed in claim 1, 3, 2, or 4, wherein the shift applied to the signal is a time-shift.

11. A method of measuring the amount of time-shift between the corresponding constituents of two signals, the method comprising the steps of:
 (i) obtaining signal samples corresponding to the discrete spectral components of a signal on a first basis set to create a plurality of first spectral components representative of the said signal;
 (ii) obtaining signal samples corresponding to the discrete spectral components of the shifted signal on a second basis set to create a plurality of second spectral components representative of the said shifted signal;
 (iii) obtaining at least one pair of signal samples corresponding to the phases of the first and second spectral components;
 (iv) subtracting said signal samples corresponding to the phases of the first and second spectral components, to derive a signal sample corresponding to the phase difference; and
 (v) obtaining the amount of time-shift between the corresponding signal constituent in the two signals from the said phase difference derived from step (iv) and the frequency of the signal constituent.

12. A method as claimed in claim 11, wherein the said spectral components in steps (i) and (ii) are obtained by means of Fourier Transform.

13. A method of measuring the amount of time-shift between the corresponding consitutents of the two signals, the method comprising the steps of:
 (i) obtaining signal samples corresponding to the discrete spectral components of a signal on a first basis set to create a plurality of first spectral components representative of the said first;
 (ii) obtaining signal samples corresponding to the discrete spectral components of the shifted signal on a second basis set to create a plurality of second spectral components representative of the said shifted signal;
 (iii) detecting the dominant spectral components, corresponding to the dominant constituents of the signal, from the first spectral components or the second spectral components, the subsequent steps being effected on the dominant spectral components;
 obtaining at least one pair of signal samples corresponding to the phases of the first and second spectral components;
 (iv) subtracting said signal samples corresponding to the phases of the first and second spectral components, to derive a signal sample corresponding to the phase difference; and
 (v) obtaining the amount of time-shift between the corresponding signal constituent in the two signals from the said phase difference derived from step (iv) and the frequency of the signal constituent.

14. A method as claimed in claim 13, wherein the said signal samples corresponding to the spectral components in steps (i) and (ii) are obtained by means of Fourier Transform.

15. A method as claimed in claim 11, 13, 12, or 14, which includes as a further step before step (v), the step of measuring the frequency of the corresponding signal constituent from at least one of the two signals.

16. A method as claimed in claim 11, 13, 12 or 14, wherein the said step (v) comprises for each dominant spectral component: making the respective phase difference modular and positive with respect to $2\pi$ and dividing the said phase difference by $2\pi$ and by the frequency of the signal constituent, to give the amount of time-shift between the corresponding signal constituent in the two signals.

17. An apparatus, for use in measuring the amount of shift between the corresponding signal constituents of two signals, the apparatus comprising:
 (i) first transform means for applying a Fourier Transform to a signal, to create a plurality of first spectral components representative of the said signal, and having an output for the first spectral components;
 (ii) second transform means connected to the input of the shifted signal, for applying a Fourier Transform to the said shifted signal to create a plurality of second spectral components representative of the said shifted signal, and having an output for the second spectral components;
 (iii) phase obtaining means connected to the outputs of the first and second transform means for obtaining the phases of the corresponding first and second spectral components and having an output for the said phases;
 (iv) phase difference obtaining means, connected to the output of the phase obtaining means, and having an output for the phase difference; and
 (v) shift obtaining means, connected to the output of the phase difference obtaining means, for obtaining the amount of shift between the corresponding signal constituents in the two signals, from the said phase difference of step (iv) and the frequency of the signal constituent.

18. An apparatus as claimed in claim 17, which includes:
 (vi) a dominant spectral component detector, which is connected to an output of one of the said first and second transform means, to determine dominant spectral components of the signal.

19. An apparatus as claimed in claim 17, wherein the phase obtaining means comprises:
 a rectangular-to-polar converter connected to an output of the first transform means, for obtaining the magnitude and phase of the first spectral components; and
 a phase obtaining unit, connected to an output of the second transform means and to an input of the phase difference obtaining means;

the rectangular-to-polar converter also being connected to the input of the phase difference obtaining means, and incorporating the magnitude obtaining means, and having an output connected to the input of the dominant spectral component detector.

20. An apparatus as claimed in claim 19, wherein the rectangular-to-polar converter is connected via a first selector to the phase difference obtaining means, and wherein the second transform means is connected via a second selector to the phase difference obtaining means.

21. An apparatus as claimed in claim 17, wherein the first and second transform means have their outputs connected to first and second output buffer registers, the first transform means being connected to the first output buffer register via the rectangular-to-polar converter.

22. An apparatus as claimed in claim 17, which includes a window coeffioient generator, for applying a predeterimined window to both a first signal and a shifted signal.

23. An apparatus as claimed in claim 22, which further includes a window coefficient register, which has an input connected to the window coefficient generator and an output, and first and second window multipliers, which are connected respectively to inputs of the first and second transform means, and have inputs connected to the output of the window coefficient register.

24. An apparatus as claimed in claim 23, which includes first and second input buffer registers, connected respectively to further inputs of the first and second window multipliers.

25. An apparatus as claimed in claim 17, 23 or 24, which includes an anti-aliasing filter and an analogue-to-digital converter, which are connected in series, and are connected to an input of the first transform means, and to the input of the second transform means.

26. An apparatus as claimed in claim 17, wherein the shaft obtaining means comprises: a circuit for adding the value $2\pi$ to the respective phase difference when that phase difference is less than 0, to produce an adjusted phase difference value; and a divider connected to the output of said circuit for dividing the adjusted phase difference value by $2\pi$ and the frequency $f_i$.

27. A method of detecting the dominant constituents of a signal from a plurality of signal samples corresponding to the phases and the magnitudes of the discrete spectral components of said signal, the method comprising steps of:
(i) obtaining a signal sample corresponding to a phase difference between the phase of one spectral component of the signal and the phase of the preceding spectral component or the phase of the subsequent spectral component of the same analysed signal;
(ii) comparing the said signal sample corresponding to said phase difference with the value $(1-1/N)\pi$, and determining that a dominant spectral component is present only when the said signal sample corresponding to the phase difference is equal to the value, $(1-1/N)\pi$, within a predetermined tolerance.

28. A method as claimed in claim 27, where said further steps, after step (ii), additionally comprise:
(iii) comparing the signal sample corresponding to the magnitude of each dominant spectral component determined by step (ii) with the signal samples corresponding to the magnitude of the subsequent and the preceding spectral components of the same signal, to determine if the said magnitude of the dominant spectral component is greater than the magnitude of subsequent and preceding spectral components;
(iv) comparing the signal sample corresponding to the magnitude of said dominant spectral component with a predetermined threshold value, to determine if the magnitude of the dominant spectral component is greater than the threshold value; and
(v) confirming that a dominant spectral component is present only when the magnitude of the dominant spectral component is greater than the magnitude of subsequent and preceding spectral components and greater than the threshold value, and when the phase between that spectral component and a subsequent or preceding spectral component is equal to said value, $(1-1/N)\pi$, within predetermined tolerances.

29. An apparatus, for use in selecting or detecting the presence of dominant spectral constituents in a signal, the apparatus comprising:
(i) a subtractor having an input for a phase of one spectral component, and an input for the phase of the adjacent spectral component of the same signal; and
(ii) a comparison means connected to an output of the subtractor for comparing the output of the subtractor with the quantity $(1-1/N)\pi$, the comparison means sending a signal indicative of a dominant spectral component if the difference between the output of the subcontractor and the value, $(1-1/N)\pi$, is less than predetermined tolerances.

30. An apparatus as claimed in claim 29, wherein the comparison means comprises one comparator for comparing the output of the subtractor with an upper-bound value, and a second comparator for comparing the output of the subtractor with a lower-bound value.

31. An apparatus as claimed in claim 29, wherein the subtractor is connected to the comparison means via a circuit for adding the quantity $2\pi$ to the output of the subtractor, if the subtractor output is negative, so that the comparison means receives a positive value.

32. An apparatus means as claimed in claim 29, which further comprises:
(iii) a first comparator having an input for the magnitude of the said spectral component of the signal as in step (i) and another input for the magnitude of a preceding spectral component of the same signal;
(iv) a second comparator having an input for the magnitude of the same spectral component as in step (i) and the magnitude of the subsequent spectral component of the same signal;
(vi) a third comparator having an input for the magnitude of the same spectral component as in step (i) and an input for a threshold value;
(vii) an AND gate having three inputs connected to outputs of the first, second and third comparators;
(v) an active transition detector, connected to an output of the AND gate in step (iv); and
(viii) an output AND gate having an input connected to the output of the active transition detector in step (vi) and an input connected to an output of the comparison means in claim 29;
whereby, in use, said output AND gate provides a signal indicative of a dominant spectral component, when the magnitude of a special component is greater than or equal to the magnitude of subsequent and preceding components and is greater than a predetermined threshold value, and when the difference between the phase of that spectral component and the phase of a subsequent or preceding component is equal to the value $(1-1/N)\pi$, within predetermined tolerances.

33. An apparatus as claimed in claim 29 or 32, which additional includes an increment counter, for recording the number of dominant spectral components, and a recorder, for recording the index values corresponding to the dominant spectral components.

* * * * *